# US010332855B2

United States Patent
Lee et al.

(10) Patent No.: US 10,332,855 B2
(45) Date of Patent: Jun. 25, 2019

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Doo Hwan Lee, Suwon-si (KR); Ju Hyeon Kim, Suwon-si (KR); Dae Kyu Ahn, Suwon-si (KR); Sung Won Jeong, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/451,880

(22) Filed: Mar. 7, 2017

(65) Prior Publication Data
US 2017/0365572 A1   Dec. 21, 2017

(30) Foreign Application Priority Data
Jun. 21, 2016   (KR) .................. 10-2016-0077630

(51) Int. Cl.
*H01L 23/00* (2006.01)
*H01L 21/48* (2006.01)
(Continued)

(52) U.S. Cl.
CPC ............ *H01L 24/20* (2013.01); *H01L 21/486* (2013.01); *H01L 21/568* (2013.01);
(Continued)

(58) Field of Classification Search
CPC ................. H01L 24/04–25; H01L 23/3142
See application file for complete search history.

(56) References Cited

U.S. PATENT DOCUMENTS 8,329,127 B2   12/2012   Cox
8,354,304 B2   1/2013   Chow et al.
(Continued)

FOREIGN PATENT DOCUMENTS

JP   2004-128286 A   4/2004
KR   10-1494417 B1   2/2015
(Continued)

OTHER PUBLICATIONS

Office Action issued in Taiwanese Patent Application No. 106107464, dated Mar. 14, 2018 (with English abstract).
(Continued)

*Primary Examiner* — Matthew E. Gordon
*Assistant Examiner* — Gardner W. S. Swan
(74) *Attorney, Agent, or Firm* — Morgan Lewis & Bockius LLP

(57) ABSTRACT

A fan-out semiconductor package includes a first connection member having a through hole, a semiconductor chip in the through hole, having an active surface with a connection pad and an inactive surface on an opposing side. An encapsulant encapsulates at least a portion of the first connection member and the semiconductor chip. A second connection member is on the first connection member and the semiconductor chip. The first connection member and the second connection member each include a redistribution layer electrically connected to a connection pad of the semiconductor chip. The interface between the second connection member and the encapsulant is located on a different level from the level of the interface between the second connection member and a redistribution layer of the first connection member or the level of the interface between the second connection member and a connection pad of the semiconductor chip.

22 Claims, 18 Drawing Sheets

(51) Int. Cl.
*H01L 21/56* (2006.01)
*H01L 23/498* (2006.01)
(52) U.S. Cl.
CPC .. *H01L 23/49827* (2013.01); *H01L 23/49838* (2013.01); *H01L 24/04* (2013.01); *H01L 24/13* (2013.01); *H01L 24/19* (2013.01); H01L 2224/02373 (2013.01); H01L 2224/02379 (2013.01); H01L 2224/02381 (2013.01); H01L 2224/0401 (2013.01); H01L 2224/04105 (2013.01); H01L 2224/12105 (2013.01); H01L 2224/13024 (2013.01); H01L 2224/2101 (2013.01); H01L 2224/214 (2013.01); H01L 2224/221 (2013.01); H01L 2224/96 (2013.01); H01L 2924/3511 (2013.01)

(56) References Cited

U.S. PATENT DOCUMENTS

| | | | |
|---|---|---|---|
| 2005/0031535 A1 | 2/2005 | Mueller et al. | |
| 2006/0269620 A1 | 11/2006 | Morris et al. | |
| 2010/0055386 A1 | 3/2010 | Ohno et al. | |
| 2010/0331968 A1 | 12/2010 | Morris et al. | |
| 2011/0300042 A1 | 12/2011 | Bull et al. | |
| 2012/0038053 A1 | 2/2012 | Oh et al. | |
| 2012/0049364 A1* | 3/2012 | Sutardja | H01L 24/24 257/738 |
| 2012/0208319 A1 | 8/2012 | Meyer et al. | |
| 2012/0217645 A1 | 8/2012 | Pagaila | |
| 2013/0195731 A1 | 8/2013 | Bull et al. | |
| 2013/0249101 A1 | 9/2013 | Lin et al. | |
| 2014/0103527 A1* | 4/2014 | Marimuthu | H01L 23/3121 257/737 |
| 2014/0159251 A1 | 6/2014 | Marimuthu et al. | |
| 2014/0170045 A1 | 6/2014 | Fedeyko et al. | |
| 2015/0004094 A1 | 1/2015 | Schmidt et al. | |
| 2015/0008586 A1 | 1/2015 | Tsai et al. | |
| 2015/0008597 A1* | 1/2015 | Lin | H01L 21/78 257/787 |
| 2015/0115465 A1 | 4/2015 | Lin et al. | |
| 2015/0140736 A1 | 5/2015 | Pendse | |
| 2015/0364394 A1* | 12/2015 | Lin | H01L 24/03 257/734 |
| 2016/0118333 A1 | 4/2016 | Lin | |

FOREIGN PATENT DOCUMENTS

| | | |
|---|---|---|
| KR | 10-2016-0024379 A | 3/2016 |
| WO | 2011/058879 A1 | 5/2011 |
| WO | 2015/026344 A1 | 2/2015 |
| WO | 2015/099684 A1 | 7/2015 |

OTHER PUBLICATIONS

Office Action issued in Japanese Application No. 2017-045939 dated Jul. 3, 2018, with English translation.
Metkar et al., "Selective catalytic reduction of NOx on combined Fe- and Cu-zeolite monolithic catalysts: Sequential and dual layer configurations," Applied Catalysis B: Environmental, 11-112, 2012 pp. 67-80.
U.S. Office Action issied in U.S. Appl. No. 15/429,850 dated Aug. 15, 2018.
Office Action issued in Taiwanese Patent Application No. 107116968, dated Sep. 14, 2018 (English abstract).
Office Action issued in Korean Patent Application No. 10-2016-0077630 dated Nov. 14, 2018, with English translation.

* cited by examiner

I-I'

II-II'

FAN-OUT SEMICONDUCTOR PACKAGE

CROSS-REFERENCE TO-RELATED APPLICATION

This application claims the benefit of priority to Korean Patent Application No. 10-2016-0077630, filed on Jun. 21, 2016 with the Korean Intellectual Property Office, the entirety of which is incorporated herein by reference.

BACKGROUND

1. Field

The present disclosure relates to a semiconductor package, for example, a fan-out semiconductor package, in which a connection terminal may be extended outwardly of an area in which a semiconductor chip is disposed.

2. Description of Related Art

A recent major trend in the development of technology related to semiconductor chips is the significant reduction in the size of components. In the field of semiconductor packages, as demand for small semiconductor chips, or the like, has increased, packages have been required to have a small size and to implement a plurality of pins.

To meet this requirement, one proposed package technology is a fan-out package. A fan-out package allows a connection terminal to be redistributed outwardly of a region in which a semiconductor chip is disposed, thereby having a small size and allowing a plurality of pins to be implemented.

In a process of manufacturing a fan-out package, a defect frequently occurs whereby an encapsulant encapsulating a semiconductor chip bleeds toward a connection pad of a semiconductor chip, or the like. In addition, via reliability may be reduced when the size of a via of a second connection member connected to a connection pad of a semiconductor chip, or the like, is not sufficiently secured.

SUMMARY

An aspect of the present disclosure provides a fan-out semiconductor package for solving a bleeding defect and improving via reliability due to an encapsulant.

According to an aspect of the present disclosure, an interface between a second connection member and an encapsulant is located on a different level from the level of an interface between the second connection member and a redistribution layer of a first connection member and the level of an interface between the second connection member and a connection pad of a semiconductor chip.

According to an aspect of the present disclosure, a fan-out semiconductor package includes: a first connection member having a through hole. A semiconductor chip is in the through hole of the first connection member, and has an active surface with a connection pad and an inactive surface on the opposing side of the semiconductor chip. An encapsulant encapsulates at least a portion of the first connection member and the semiconductor chip. A second connection member is on the first connection member and the semiconductor chip. The first connection member and the second connection member each include a redistribution layer electrically connected to the connection pad of the semiconductor chip. An interface between the second connection member and the encapsulant is located on a different level from the level of an interface between the second connection member and the redistribution layer of the first connection member or the level of an interface between the second connection member and the connection pad of the semiconductor chip.

According to an aspect of the present disclosure, a lower surface of the redistribution layer of the first connection member has a step height from a lower surface of the encapsulant.

According to an aspect of the present disclosure, a lower surface of the connection pad of the semiconductor chip has a step height from a lower surface of the encapsulant.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
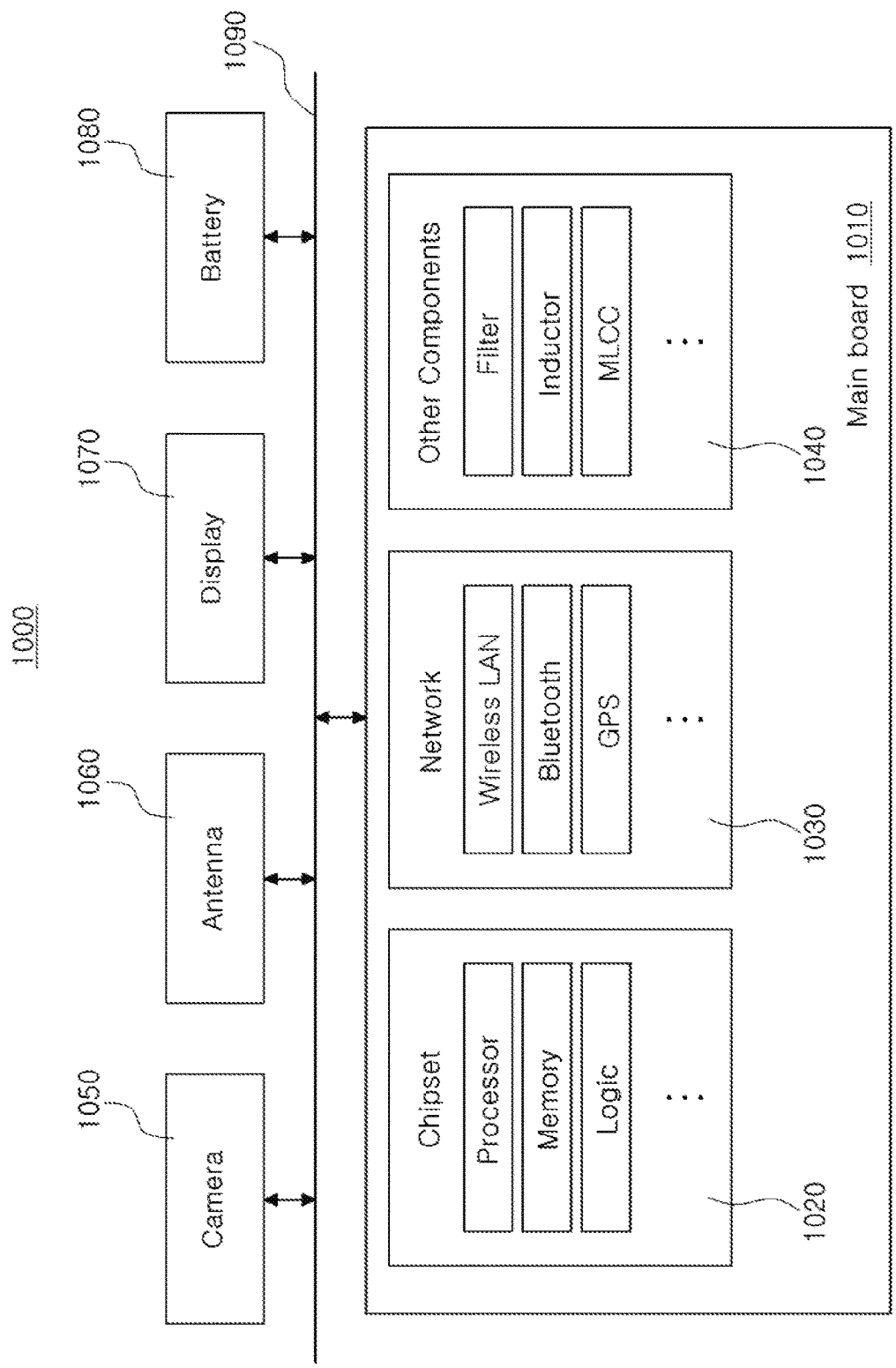
FIG. 1 is a block diagram schematically illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through an adhesive layer as well as a direct connection between two components. In addition, "electrically connected" may or may not include a physical connection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are designated in context of their illustration in the attached drawings. For example, a first connection member is disposed on a level above a redistribution layer. However, the claims are not limited thereto. A vertical direction refers to the abovementioned upward and downward directions, and a horizontal direction refers to a direction perpendicular to the abovementioned upward and downward directions. A vertical cross section refers to a case taken along a plane in the vertical direction, and an example thereof may be a cross-sectional view illustrated in the drawings. A horizontal cross section refers to a case taken along a plane in the horizontal direction, and an example thereof may be a plan view illustrated in the drawings.

Terms used herein describe an exemplary embodiment and do not necessarily limit the present disclosure. Singular forms include plural forms unless interpreted otherwise in context.

Electronic Device

FIG. 1 is a block diagram schematically illustrating an example of an electronic device system.

Referring to FIG. 1, an electronic device 1000 may accommodate a main board 1010. The main board 1010 may include chip-related components 1020, network-related components 1030, other components 1040, and the like, physical and/or electrically connected thereto. These components may be connected to other components to be described below to form various signal lines 1090.

The chip-related components 1020 may include a memory chip, such as a volatile memory (for example, a dynamic random access memory (DRAM)), a non-volatile memory (for example, a read only memory (ROM)), a flash memory, or the like; an application processor chip, such as a central processor (for example, a central processing unit (CPU)), a graphics processor (for example, a graphics processing unit (GPU)), a digital signal processor, a cryptographic processor, a microprocessor, a microcontroller, or the like; and a logic chip, such as an analog-digital converter (ADC), an application-specific IC (ASIC), or the like. However, the chip-related components 1020 are not limited thereto, but may also include other types of chip-related components. The chip-related components 1020 may be combined with each other.

The network-related components 1030 may include components for protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, 5G, and any other wireless and wired protocols designated after the above mentioned protocols. However, the network-related components 1030 are not limited thereto, but may also include components for a variety of other wireless or wired standards or protocols. The network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic condenser (MLCC), or the like. However, other components 1040 are not limited thereto, but may also include passive components used for various other purposes, or the like. Other components 1040 may be combined with each other, together with the chip-related components 1020 and/or the network-related components 1030 described above.

Depending on a type of electronic device 1000, the electronic device 1000 may include other components that may or may not be physical and/or electrically connected to the main board 1010. The other components may include, for example, a camera 1050, an antenna 1060, a display 1070, a battery 1080, an audio codec (not shown), a video codec (not shown), a power amplifier (not shown), a compass (not shown), an accelerometer (not shown), a gyroscope (not shown), a speaker (not shown), a mass storage unit (for example, a hard disk drive) (not shown), a compact disk (CD) (not shown), a digital versatile disk (DVD) (not shown), or the like. However, the other components are not limited thereto, but may also include additional components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video games machine, a smartwatch, an automotive component, or the like. However, the electronic device 1000 is not limited thereto, and may be any other electronic device able to process data.

Figure 2:
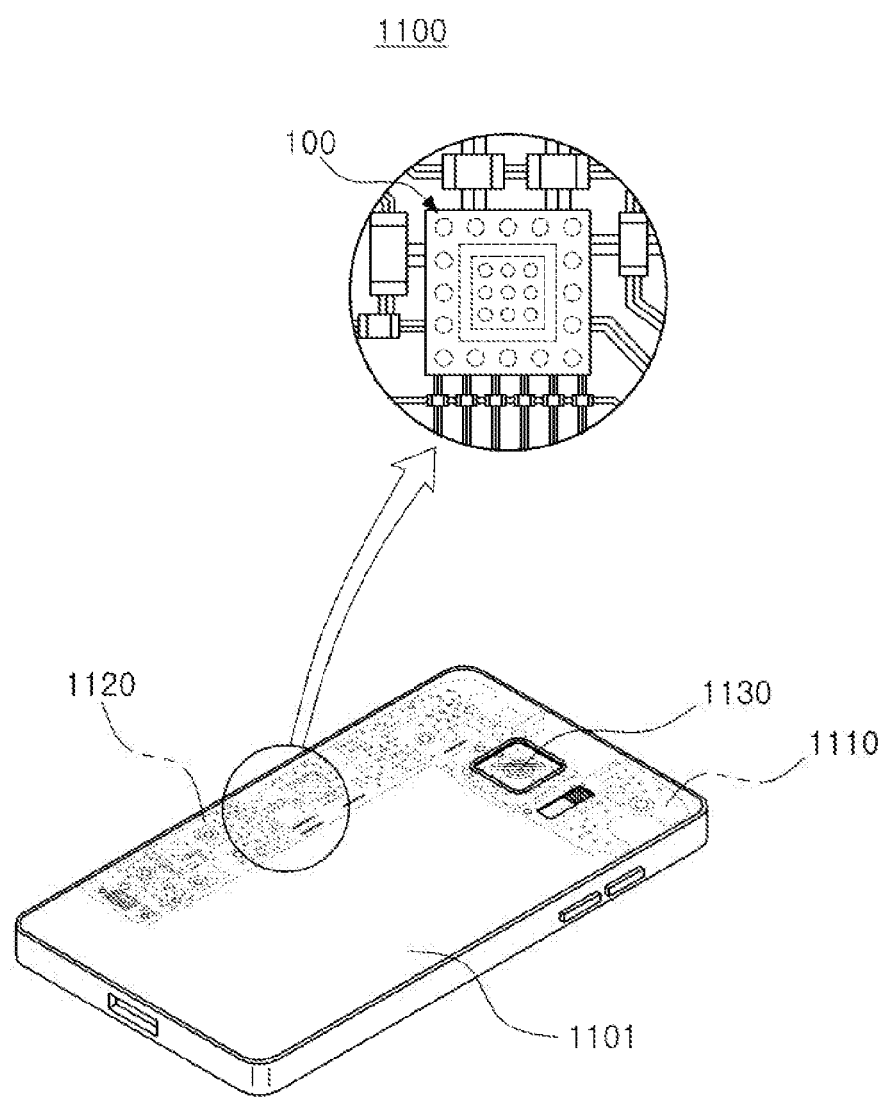
FIG. 2 is a perspective view schematically illustrating an example of an electronic device.

FIG. 2 is a schematic perspective view illustrating an example of an electronic device.

Referring to FIG. 2, a semiconductor package may be used for various purposes in the various electronic devices as described above. For example, a main board 1110 may be accommodated inside a body 1101 of a smartphone 1100, and various components 1120 may be physical and/or electrically connected to the main board 1110. Other components may or may not be physical and/or electrically connected to the main board 1110, such as a camera 1130, may be accommodated inside the body 1101. Some of components 1120 may be chip-related components, and a semiconductor package 100 may be, for example, an application processor, but is not limited thereto. The electronic device is not necessarily limited to the smartphone 1100, and may be other electronic devices as described above.

Semiconductor Package

Generally, a number of fine electrical circuits may be integrated into a single semiconductor chip. However, the semiconductor chip may not serve as a finished semiconductor product in itself, and may be damaged due to external physical or chemical impacts. Therefore, the semiconductor chip alone is not used, but is packaged and is used in an electronic device, or the like, in a packaged state.

Semiconductor packaging is required due to the existence of a difference in circuit width between a semiconductor chip and a main board of an electronic device in terms of electrical connectivity. The size of the connection pads of the semiconductor chip and the interval of the connection pads of the semiconductor chip are very fine, but the size of the component mounting pads of the main board used in the electronic device and the interval between the component mounting pads of the main board used are significantly larger than the semiconductor chip. Therefore, it may be difficult to directly mount the semiconductor chip on the main board, and packaging technology for buffering a difference in circuit width between the semiconductor chip and the main board is required.

The semiconductor package manufactured by the packaging technology may be classified as a fan-in semiconductor package and a fan-out semiconductor package, depending on a structure and a purpose thereof.

Hereinafter, the fan-in semiconductor package and the fan-out semiconductor package will be described in more detail with reference to the drawings.

Fan-In Semiconductor Package

Figure 3B:
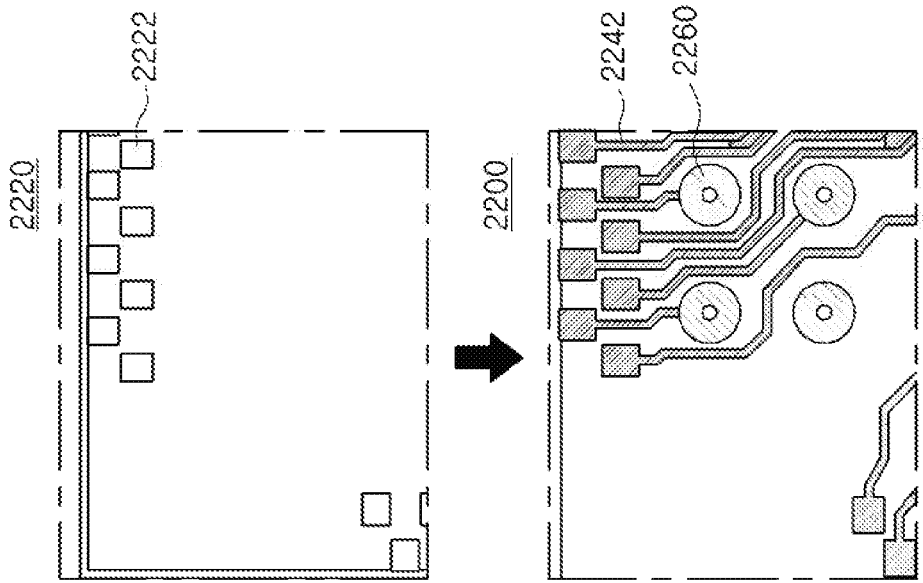
FIGS. 3A and 3B are schematic cross-sectional views illustrating a fan-in semiconductor package before and after packaging.
Figure 3A:
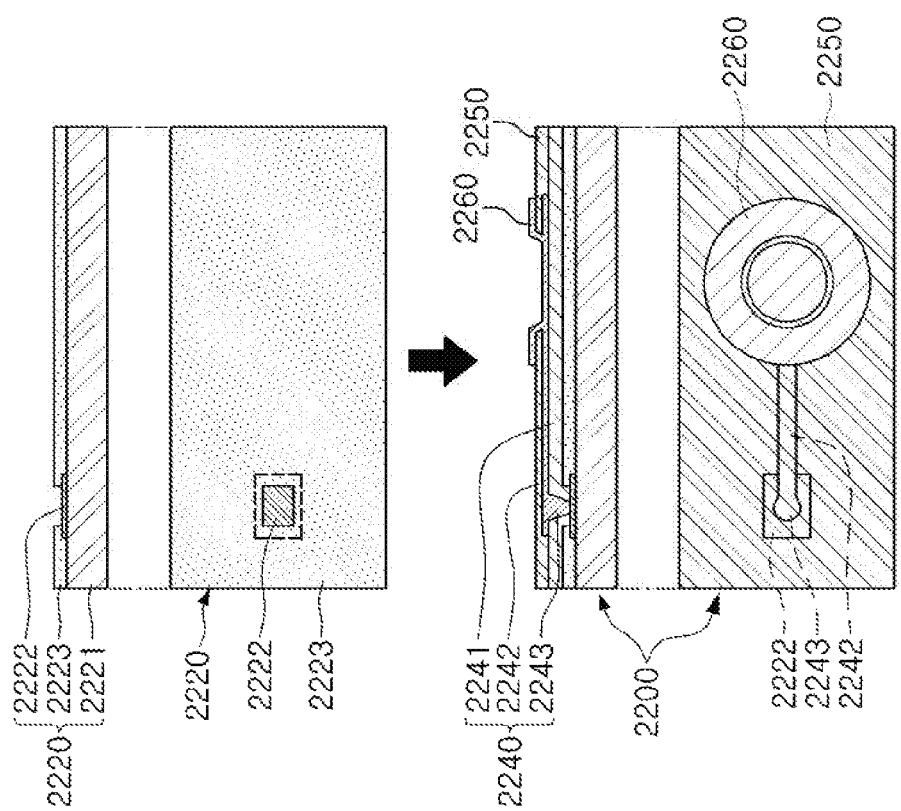

FIGS. 3A and 3B are schematic cross-sectional views illustrating a fan-in semiconductor package before and after packaging.

Figure 4:
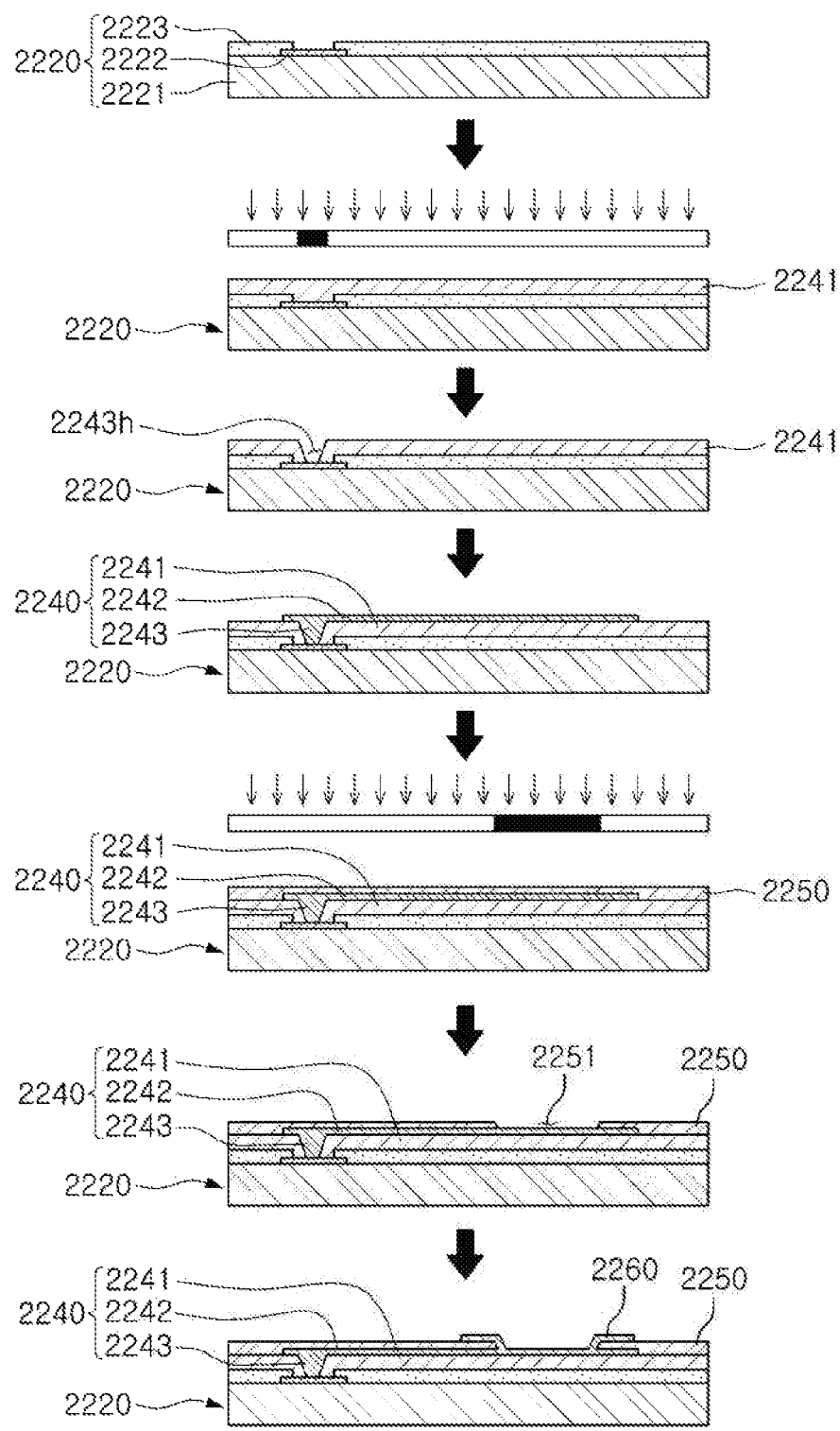
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 comprising silicon (Si), germanium (Ge), gallium arsenide (GaAs), or the like; connection pads 2222 formed on one surface of the body 2221 and including a conductive material such as aluminum (Al), or the like; and a passivation film 2223 such as an oxide film, a nitride film, or the like, formed on one surface of the body 2221 and covering at least a portion of the connection pads 2222. Since the connection pads 2222 are significantly small, it may be difficult to mount the integrated circuit (IC) on an intermediate level printed circuit board (PCB) as well as a main board of an electronic device, or the like.

Therefore, a connection member 2240 may be formed on the semiconductor chip 2220, depending on a size of the semiconductor chip 2220, in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. A passivation layer 2250 protecting the connection member 2240 may be formed, an opening 2251 may be formed, and an under bump metal layer 2260, or the like may be formed. A fan-in semiconductor package 2200 including, for example, the semiconductor chip 2220, the connection member 2240, the passivation layer 2250, and the under bump metal layer 2260 may thus be manufactured.

The fan-in semiconductor package may have a package form in which all connection pads, for example, input/output (I/O) terminals, of the semiconductor chip are disposed inside an element, may have excellent electrical characteristics, and may be able to be produced at low cost. Therefore, many elements mounted in a smartphone have been manufactured in a fan-in semiconductor package form and developed to implement a rapid signal transfer while having a compact size.

Since all I/O terminals are required to be disposed inside the semiconductor chip in the fan-in semiconductor package, the fan-in semiconductor package has a significant spatial limitation. Therefore, it is difficult to apply this structure to a semiconductor chip having a large number of I/O terminals or a semiconductor chip having a compact size. Due to the disadvantage described above, the fan-in semiconductor package may not be directly mounted and used on the main board of the electronic device. Even when the size of the I/O terminals of the semiconductor chip and the interval between the I/O terminals of the semiconductor chip are increased in a redistribution process, the size of the I/O terminals of the semiconductor chip and the interval between the I/O terminals of the semiconductor chip may not be sufficient to directly mount the fan-in semiconductor package on the electronic device main board.

Figure 5:
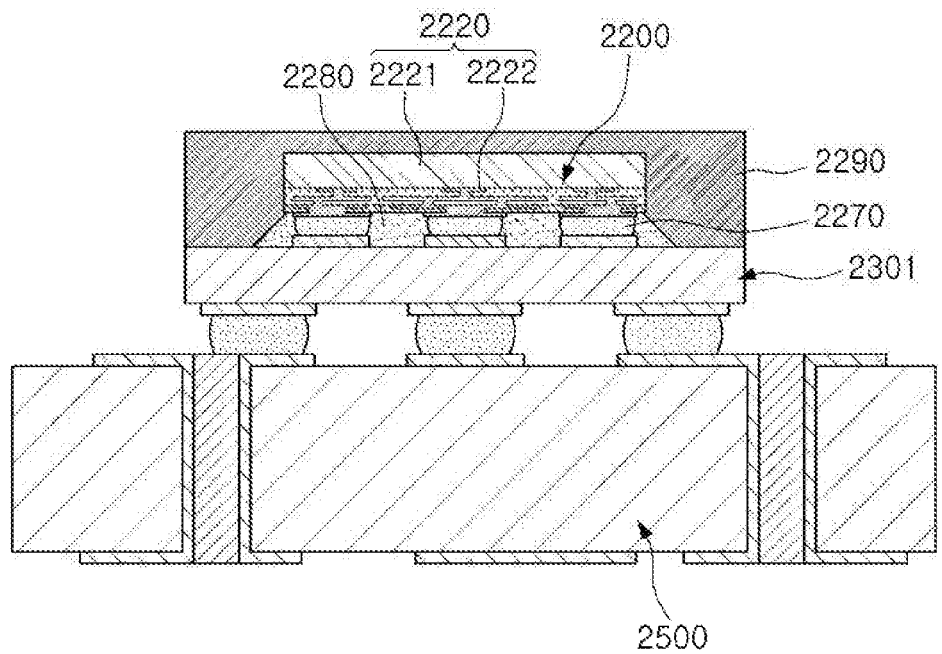
FIG. 5 is a schematic cross-sectional view illustrating a case in which a fan-in semiconductor package is mounted on an interposer substrate to ultimately be mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
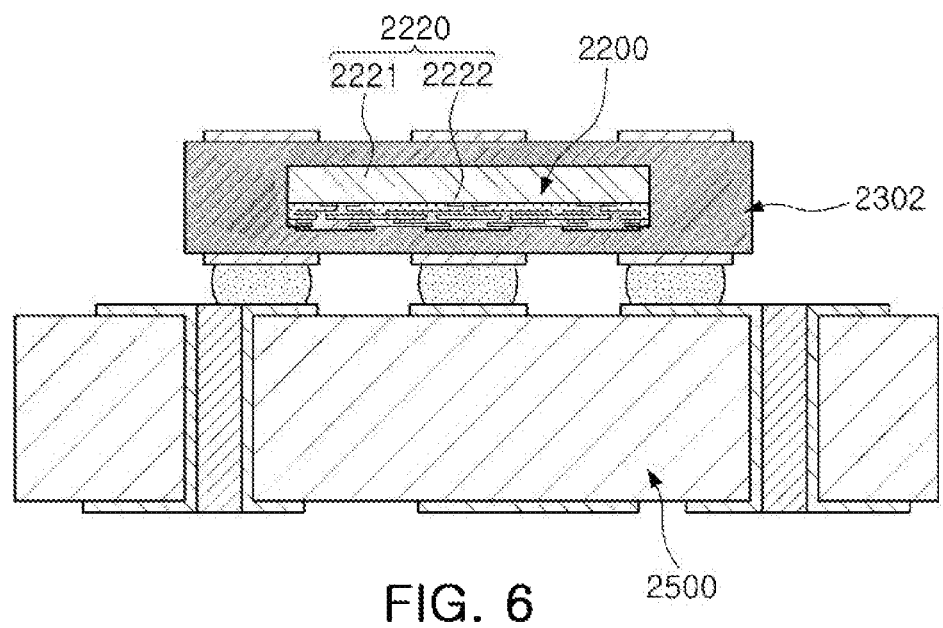
FIG. 6 is a schematic cross-sectional view illustrating a case in which a fan-in semiconductor package is embedded in an interposer substrate to ultimately be mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in the fan-in semiconductor package 2200, connection pads 2222, that is, I/O terminals, of a semiconductor chip 2220 may be redistributed through an interposer substrate 2301, and the fan-in semiconductor package 2200 may ultimately be mounted on a main board 2500 of an electronic device with the electronic device mounted on the interposer substrate 2301. Solder balls 2270, and the like, may be fixed to an underfill resin 2280, or the like, and an outer side of the semiconductor chip 2220 may be covered with a molding material 2290, or the like. Alternatively, the fan-in semiconductor package 2200 may be embedded in a separate interposer substrate 2302, with the connection pads 2222 of the semiconductor chip 2220 redistributed by the interposer substrate 2302 with the fan-in semiconductor package embedded in the interposer substrate, and the fan-in semiconductor package ultimately mounted on the main board 2500 of an electronic device.

It may be difficult to directly mount and use the fan-in semiconductor package on the main board of the electronic device. Therefore, as described above the fan-in semiconductor package may be mounted on a separate interposer substrate, and then mounted on the main board of the electronic device through a packaging process or may be mounted and used on the main board of the electronic device by being embedded in the interposer substrate.

Fan-Out Semiconductor Package

Figure 7:
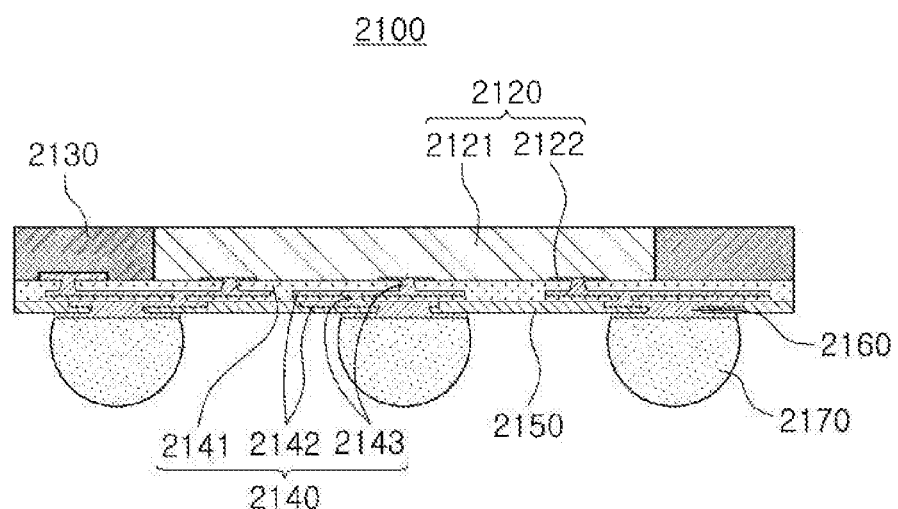
FIG. 7 is a schematic cross-sectional view illustrating a fan-out semiconductor package.

FIG. 7 is a schematic cross-sectional view illustrating a fan-out semiconductor package.

Referring to the drawings, in a fan-out semiconductor package 2100, for example, an outer side of a semiconductor chip 2120 may be protected by an encapsulant 2130. Connection pads 2122 of the semiconductor chip 2120 may be redistributed outwardly of the semiconductor chip 2120 by a connection member 2140. A passivation layer 2150 may be further formed on the connection member 2140, and under bump metal layers 2160 may be further formed in openings of the passivation layer 2150. Solder balls 2170 may be further formed on the under bump metal layers 2160. The semiconductor chip 2120 may be an integrated circuit (IC) including a body 2121, the connection pads 2122, a passivation film (not shown), and the like. The connection member 2140 may include an insulating layer 2141, redistribution layers 2142 formed on the insulating layer 2241, and vias 2143 electrically connecting the connection pads 2122, the redistribution layers 2142, and the like, to each other.

As described above, the fan-out semiconductor package may have a form in which I/O terminals are redistributed and disposed outwardly of the semiconductor chip through the connection member formed on the semiconductor chip. In the fan-in semiconductor package, all I/O terminals of the semiconductor chip are required to be disposed inside the semiconductor chip. Therefore, the size of an element is decreased, and the size and pitch of balls are required to be decreased, such that a standardized ball layout may not be appropriate for the fan-in semiconductor package. The fan-out semiconductor package described above has a form in which the I/O terminals are redistributed and disposed outwardly of the semiconductor chip through the connection member formed on the semiconductor chip. Therefore, even when the size of the semiconductor chip is decreased, a standardized ball layout may be used in the fan-in semiconductor package as it is, such that the fan-in semiconductor package may be mounted on the main board of the electronic device without using a separate interposer substrate, as described below.

Figure 8:
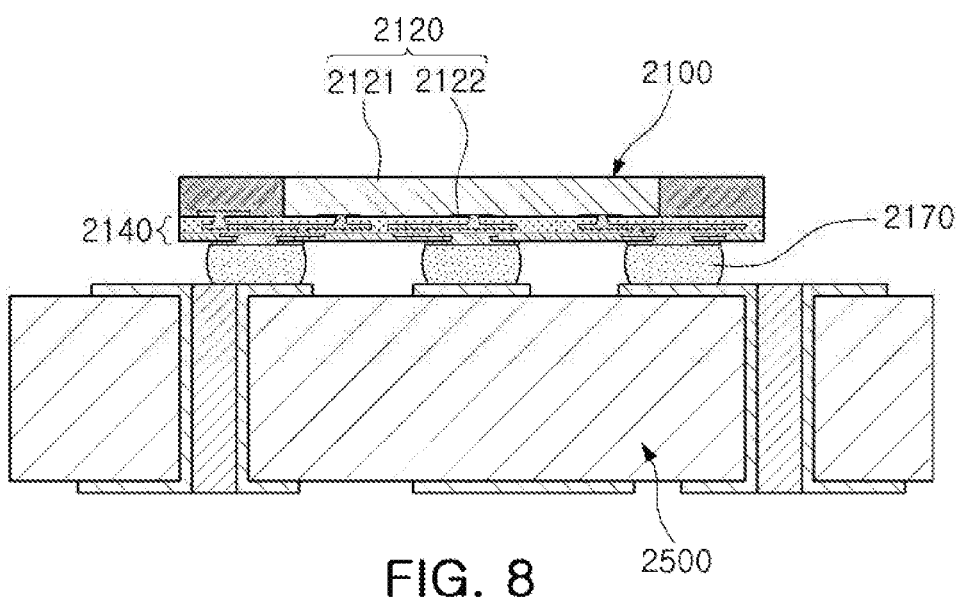
FIG. 8 is a schematic cross-sectional view illustrating a case in which a fan-out semiconductor package is mounted on a main board of an electronic device.

FIG. 8 is a schematic cross-sectional view illustrating a case where a fan-out semiconductor package is mounted on a main board of an electronic device.

Referring to the drawings, a fan-out semiconductor package 2100 may be mounted on a main board 2500 of an electronic device through solder balls 2170, or the like. The fan-out semiconductor package 2100 includes the connection member 2140 that is formed on the semiconductor chip 2120 and is capable of redistributing the connection pads 2122 to a fan-out region outside the size range of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

Since the fan-out semiconductor package may be mounted on the main board of the electronic device without a separate interposer substrate, the fan-out semiconductor package may be implemented at a thickness less than that of the fan-in semiconductor package using the interposer substrate. Therefore, the semiconductor package may be miniaturized and thinned, and may have excellent thermal and electrical characteristics, making it particularly appropriate for a mobile product. The semiconductor package may be more compact than a general package on package (POP) type semiconductor package using a printed circuit board (PCB), and may solve a problem due to the occurrence of a warpage phenomenon.

The fan-out semiconductor package refers to a package technology for mounting the semiconductor chip on the main board of the electronic device, or the like, as described above, and protecting a semiconductor chip from external impacts. The fan-out semiconductor package is a different concept from that of a printed circuit board (PCB), such as an interposer substrate, or the like, having a different scale or purpose from those of the fan-in semiconductor package, with the fan-in semiconductor package embedded therein.

Hereinafter, a fan-out semiconductor package in which a bleeding defect is able to be improved and via reliability is able to be improved due to an encapsulant, will be described with reference to the drawings.

Figure 9:
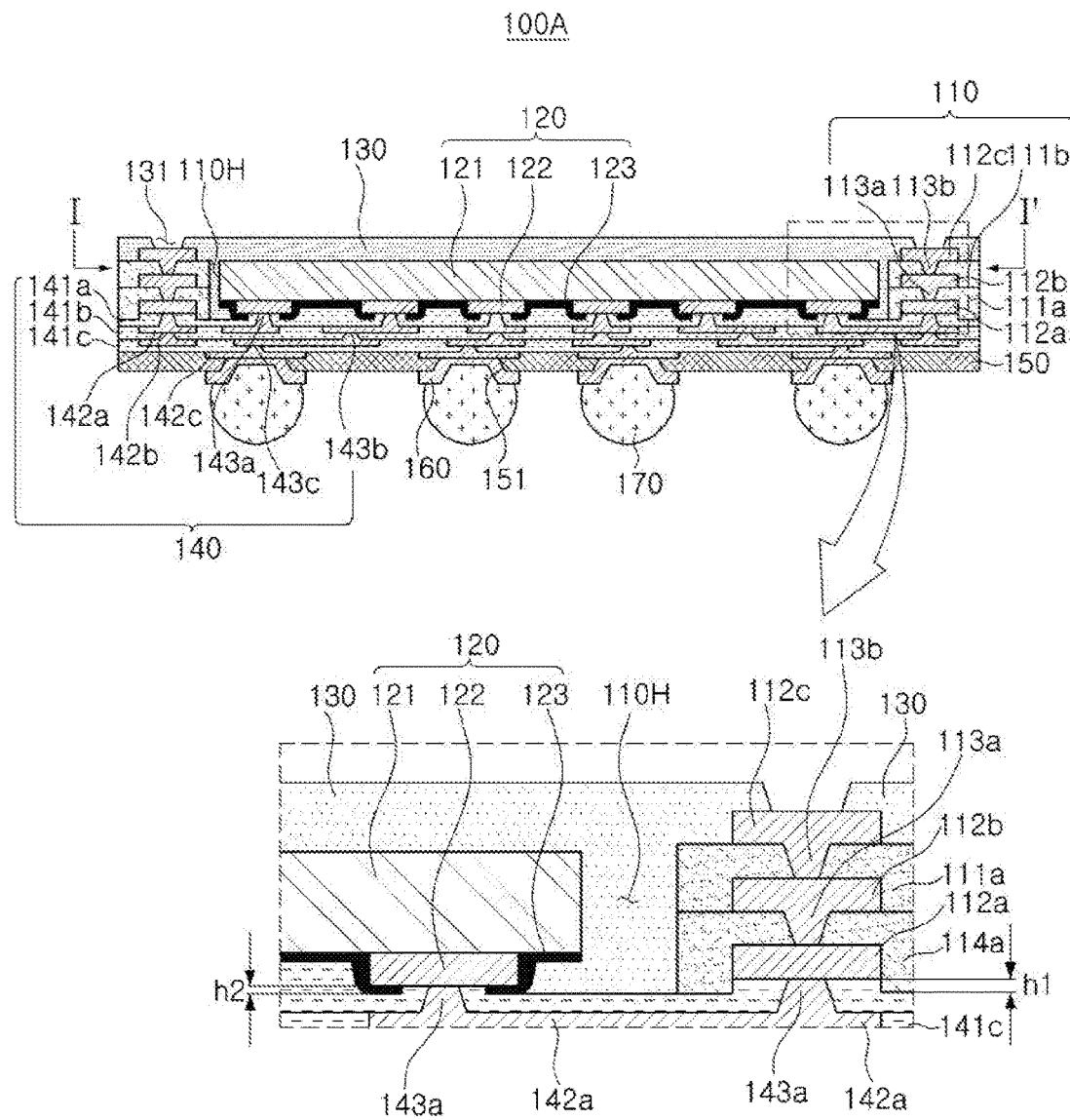
FIG. 9 is a schematic cross-sectional view illustrating an example of a fan-out semiconductor package.

FIG. 9 is a schematic cross-sectional view illustrating an example of a fan-out semiconductor package.

Figure 10:
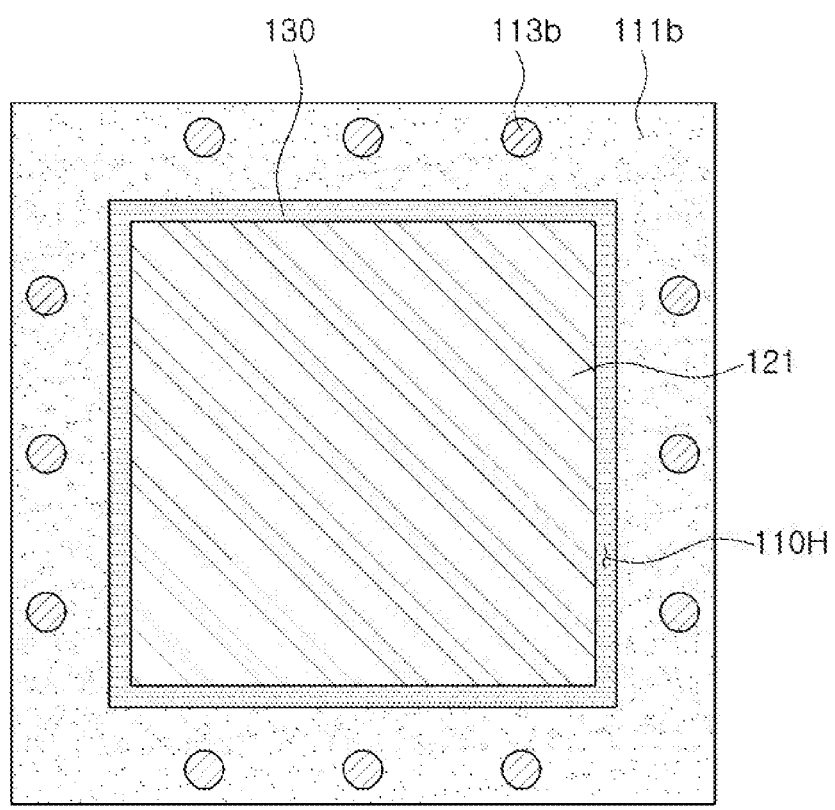
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to the drawings, a fan-out semiconductor package 100A according to an exemplary embodiment in the present disclosure may include a first connection member 110 having a through hole 110H and a redistribution layer 112a formed in a lower side. A semiconductor chip 120 is disposed in the through hole 110H of the first connection member 110, with a connection pad 122 formed in a lower side. A second connection member 140 is disposed below the first connection member 110 and the semiconductor chip 120 and is connected to the redistribution layer 112a of the first connection member 110 and the connection pad 122 of the semiconductor chip 120. An encapsulant 130 encapsulates at least a portion of the first connection member 110 and the semiconductor chip 120 and is in contact with one surface of the second connection member 140. One surface of the encapsulant 130 in contact with one surface of the second connection member 140 may have respective step heights h1 and h2 with one surface of the redistribution layer 112a of the first connection member 110 and one surface of the connection pad 122 of the semiconductor chip 120. In other words, an interface between the second connection member 140 and the encapsulant 130 may be located on a level different from those of an interface between the second connection member 140 and the redistribution layer 112a and/or an interface between the second connection member 140 and the connection pad 122.

Since one surface of the encapsulant 130 in contact with one surface of the second connection member 140 has respective step heights h1 and h2 with one surface of the redistribution layer 112a and/or one surface of the connection pad 122, when the encapsulant 130 is formed, a resin for formation of the encapsulant 130 may be prevented from bleeding toward the redistribution layer 112a of the first connection member 110 and the connection pad 122 of the semiconductor chip 120. An insulating layer 111a of the first connection member 110 and a passivation film 123 of the semiconductor chip 120, to allow the redistribution layer 112a and the connection pad 122 to be recessed inwardly, may serve as a barrier preventing a resin for formation of the encapsulant 130 from bleeding before the resin is hardened.

Having one surface of the encapsulant 130 in contact with one surface of the second connection member 140 with the step heights h1 and h2 allows for relatively large vias 143a of the second connection member 140, connected to the redistribution layer 112a and the connection pad 122. In the vias 143a of the second connection member 140 connected to the redistribution layer 112a and the connection pad 122, cracking, delamination, or the like, may occur due to stress generated by various causes. When the volume of the vias 143a is sufficiently ensured by being relatively large, the problems described above may be significantly reduced, thereby further improving reliability.

Hereinafter, each configuration included in the fan-out semiconductor package 100A according to an exemplary embodiment in the present disclosure will be described in more detail.

Since the first connection member 110 serves to support the fan-out semiconductor package 100A, stiffness may be easily maintained and uniformity of thickness of the encapsulant 130 may be easily secured. Because a routing area is provided to form redistribution layers 112a, 112b, and 112c, the number of layers of the second connection member 140 may be reduced, which may solve the problem of defects occurring when forming the second connection member 140. The first connection member 110 may have the through hole 110H, and may be disposed to be spaced apart from the first connection member 110 inside the through hole 110H by a predetermined distance. In other words, the vicinity of a side of the semiconductor chip 120 is surrounded by the first connection member 110. However, an exemplary embodiment is not limited thereto, and may be variously modified in other forms.

The first connection member 110 may include a plurality of insulating layers 111a and 111b, with the redistribution layer 112a embedded therein to expose one surface to a lower side, a redistribution layer 112c disposed to allow one surface to protrude to an upper side, and a redistribution layer 112b disposed inside. The first connection member may include a via 113a passing through a portion of the insulating layer 111a to connect the redistribution layers 112a and 112b to each other, and a via 113b passing through a portion of the insulating layer 111b to connect the redistribution layers 112b and 112c to each other.

In the drawings, the first connection member 110 is illustrated as being provided as two insulating layers 111a and 111b, with vias 113a and 113b, but the number of insulating layers with vias in the first connection member 110 may be more than two. The number of redistribution layers disposed inside may likewise be increased.

The material of the insulating layers 111a and 111b is not particularly limited as long as the material is able to support a package. For example, an insulating material may be used for the material thereof, which can be a thermosetting resin such as an epoxy resin, a thermoplastic resin such as polyimide, or a resin in which a reinforcing material such as a glass fiber and/or an inorganic filler is impregnated, for example, prepreg, an Ajinomoto build-up film (ABF), FR-4, Bismaleimide Triazine (BT), or the like. If necessary, a PID resin may be used as the insulating material.

The redistribution layers 112a, 112b, and 112c serve as a redistribute pattern, and a formation material thereof may be a conductive material such as copper (Cu), aluminum (Al), silver (Ag), tin (Sn), gold (Au), nickel (Ni), lead (Pb), titanium (Ti), alloys thereof, or the like. The redistribution layers 112a, 112b, and 112c may perform various functions depending on designs of corresponding layers. For example, the redistribution layers may serve as a ground (GND) pattern, a power (PWR) pattern, a signal (S) pattern, or the like. The signal (S) pattern may include various signals other than those of the ground (GND) pattern, the power (PWR) pattern, and the like, and may be, for example, a data signal, and the like. The redistribution layers may include a via pad, a connection terminal pad, and the like.

A surface treatment layer (not shown) may be further formed as needed on a portion of the uppermost redistribution layer, that is, in the present exemplary embodiment, redistribution layer 112c of the redistribution layers 112a, 112b, and 112c, which is exposed through an opening 131 in the encapsulant 130. The surface treatment layer (not shown) may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

In the lowermost redistribution layer, that is, in the present exemplary embodiment, redistribution layer 112a of the redistribution layers 112a, 112b, and 112c, which is connected to the second connection member 140, one surface connected to the second connection member 140 is recessed upwardly of the first connection member 110, based on one surface of the encapsulant 130 in contact with one surface of the second connection member 140, to have a step height h1. Therefore, as described above, when the encapsulant 130 is formed, a resin for formation of the encapsulant 130 is prevented from bleeding toward the redistribution layer 112a of the first connection member 110. The step height h1 may be 0.5 µm to 4.0 µm, is preferably, 1.0 µm to 4.0 µm, and is more preferably, 2.0 µm to 4.0 µm. When a depth is provided as described above, a bleeding prevention effect is excellent and a sufficient volume of the vias 143a of the second connection member 140 connected to the redistribution layer 112a is able to be secured.

The vias 113a and 113b allow the redistribution layers 112a, 112b, and 112c formed in different layers to be electrically connected to each other. As a result, an electrical path is formed inside the first connection member 110. A formation material of the vias 113a and 113b may be a conductive material, such as copper (Cu), aluminum (Al), silver (Ag), tin (Sn), gold (Au), nickel (Ni), lead (Pb), titanium (Ti), alloys thereof, or the like. The vias 113a and 113b may be completely filled with a conductive material, or a conductive material may be formed along a wall of a via hole unlike in the drawing. Any shapes may be applied, including a cylindrical shape, or the like, in addition to a tapered shape.

The semiconductor chip 120 may be an integrated circuit (IC) in which hundreds to millions of elements or more are integrated inside a single chip. The integrated circuit, for example, may be an application processor chip such as a central processor (for example, a CPU), a graphics processor (for example, a GPU), a digital signal processor, a cryptographic processor, a microprocessor, a microcontroller, and the like, but is not limited thereto.

When the semiconductor chip 120 is the integrated circuit, the semiconductor chip may include a body 121, the connection pad 122 may be formed on a surface of the body 121, and the passivation film 123 may be formed on the surface of the body 121 and cover a portion of the connection pad 122. The body 121 may be formed on the basis of, for example, an active wafer. In this case, a base material may be formed using silicon (Si), germanium (Ge), gallium arsenide (GaAs), and the like. The connection pad 122 is provided to allow the semiconductor chip 120 to be electrically connected to other components, and as a formation material thereof, a conductive material may be used without limitation. The connection pad 122 may be redistributed by the second connection member 140, the first connection member 110, or the like. In the semiconductor chip 120, the surface with the connection pad 122 is an active surface, and the opposing surface is an inactive surface. The passivation film 123 serves to protect the body 121 from an external environment. For example, the passivation film may be formed as an oxide film, a nitride film, or the like, or may be formed of a double layer of an oxide film and a nitride film. Furthermore, an additional insulating film (not shown), or the like, may be further disposed between the body 121 and the connection pad 122, and between the body 121 and the passivation film 123.

In the connection pad 122, one surface connected to the second connection member 140 is recessed upwardly in relation to a surface of the encapsulant 130 in contact with the surface of the second connection member 140, to have a step height h2. Therefore, as described above, when the encapsulant 130 is formed, a resin for formation of the encapsulant 130 is prevented from bleeding toward the connection pad 122 of the semiconductor chip 120. The step height h2 may be 0.5 µm to 1.0 µm, is preferably, 0.5 µm to 0.9 µm, and is more preferably, 0.5 µm to 0.8 µm. When a depth is provided as described above, a bleeding prevention effect is excellent and a sufficient volume of the vias 143a of the second connection member 140 connected to the connection pad 122 is able to be secured.

The step height h1 for the redistribution layer 112a may be greater than the step height h2 for the connection pad 122. In other words, h1>h2 may be satisfied. The vias 143a connected to the redistribution layer 112a of the first connection member 110 may secure a larger volume than the vias 143a connected to the connection pad 122. Once a sufficient size of the vias 143a connected to the redistribution layer 112a is ensured, it may be more advantageous in securing signal transmission reliability.

The encapsulant 130 is configured to protect the first connection member 110 and/or the semiconductor chip 120. The form of the encapsulant is not particularly limited, as long as the encapsulant covers at least a portion of the first connection member 110 and/or the semiconductor chip 120. For example, the encapsulant 130 may fill upper sides of the first connection member 110 and the semiconductor chip 120, and a space between the first connection member 110 and the semiconductor chip 120 inside the through hole 110H. The encapsulant 130 may fill at least a portion of a space between the passivation film 123 of the semiconductor chip 120 and the second connection member 140. Since the encapsulant 130 fills the through hole 110H, the encapsulant may serve as an adhesive depending on a specific material and may reduce buckling at the same time.

The encapsulant 130 may be formed of a plurality of layers formed using a plurality of materials. For example, a space inside the through hole 110H can be filled with a first encapsulant, and the first connection member 110 and the semiconductor chip 120 can be covered with a second encapsulant. Alternatively, a first encapsulant can be used to fill a space inside the through hole 110H and to cover the first connection member 110 and the semiconductor chip 120 to a predetermined thickness, and a second encapsulant can be further covered on the first encapsulant to a predetermined thickness. In addition to this, the encapsulant may be applied in various forms.

A specific material of the encapsulant 130 is not particularly limited. For example, the specific material of the encapsulant may be an insulating material. In this case, the insulating material may be a thermosetting resin such as an epoxy resin, a thermoplastic resin such as polyimide, a resin in which a reinforcing material such as a glass fiber and/or an inorganic filler is impregnated, for example, prepreg, ABF, FR-4, BT, a PID resin, or the like. Alternatively, a molding material such as EMC, or the like may also be used as the insulating material.

The encapsulant 130 may have an elastic modulus lower than that of a formation material of the insulating layers 111a and 111b of the first connection member 110. With the elastic modulus of the encapsulant 130 being relatively small, warpage of the fan-out semiconductor package 100A may be reduced through a buckling effect with respect to the semiconductor chip 120 and a stress dispersion effect.

Because the encapsulant 130 fills a space of the through hole 110H, there may be a buckling effect with respect to the semiconductor chip 120. As the encapsulant covers the semiconductor chip 120, stress generated in the semiconductor chip 120 may be dispersed and dissipated. However, when the elastic modulus is significantly low, deformation may become significantly severe, whereby the encapsulant may be unable to perform its basic role.

The encapsulant 130 may include a conductive particle as required for electromagnetic interception. Any conductive particles may be used as long as electromagnetic interception is possible. The conductive particle may be formed using, for example, copper (Cu), aluminum (Al), silver (Ag), tin (Sn), gold (Au), nickel (Ni), lead (Pb), titanium (Ti), solder, or the like, by way of example, but is not limited thereto.

The second connection member 140 is configured to redistribute the connection pad 122 of the semiconductor chip 120. Several tens or several hundreds of connection pads 122 having various functions may be redistributed through the second connection member 140, and may be physically and/or electrically connected externally according to a function thereof by a connection terminal 170. The second connection member 140 may include insulating layers 141a, 141b, and 141c, redistribution layers 142a, 142b, and 142c disposed on the insulating layers 141a, 141b, and 141c, and vias 143a, 143b, and 143c passing through the respective insulating layers 141a, 141b, and 141c and electrically connecting the redistribution layers 142a, 142b, and 142c. In the fan-out semiconductor package 100A according to an exemplary embodiment in the present disclosure, the second connection member 140 may be formed of a plurality of redistribution layers 142a, 142b, and 142c, but is not limited thereto. Alternatively, the second connection member may be formed as a monolayer structure or may have the number of layers different from above.

An insulating material may be used for the insulating layers 141a, 141b, and 141c. In addition to the insulating material described above, a photoimagable dielectric material such as a PID resin may be used. The insulating layers 141a, 141b, and 141c may be formed to be relatively thin, and fine pitches of the vias 143a, 143b, and 143c may be more easily achieved. The materials of the insulating layers 141a, 141b, and 141c may be the same, or may be different if necessary. The insulating layers 141a, 141b, and 141c may be integrated such that the boundaries are unclear.

The redistribution layers 142a, 142b, and 142c may substantially serve to undertake redistribution, and a formation material thereof may be a conductive material such as copper (Cu), aluminum (Al), silver (Ag), tin (Sn), gold (Au), nickel (Ni), lead (Pb), titanium (Ti), or alloys thereof, or the like. The redistribution layers 142a, 142b, and 142c may serve to perform various functions depending on designs of corresponding layers. For example, the redistribution layers may serve as a ground (GND) pattern, a power (PWR) pattern, a signal (S) pattern, or the like. Here, the signal (S) pattern may include various signals other than the ground (GND) pattern, the power (PWR) pattern, and the like, for example, a data signal, and the like. The redistribution layers may include a via pad, a connection terminal pad, and the like.

A surface treatment layer (not shown) may be further formed as needed on some exposed surfaces of the redistribution layer 142c of the redistribution layers 142a, 142b, and 142c. The surface treatment layer (not shown) is not particularly limited and may be formed by, for example, electrolytic gold plating, electroless gold plating, OSP or electroless tin plating, electroless silver plating, electroless nickel plating/substituted gold plating, DIG plating, HASL, or the like.

The vias 143a, 143b, and 143c allow the redistribution layers 142a, 142b, and 142c formed in different layers, the connection pad 122, and the like, to be electrically connected to each other. As a result, an electrical path is formed inside the fan-out semiconductor package 100A. The formation material of the vias 143a, 143b, and 143c may be a conductive material, such as copper (Cu), aluminum (Al), silver (Ag), tin (Sn), gold (Au), nickel (Ni), lead (Pb), titanium (Ti), or alloys thereof, or the like. The vias 143a, 143b, and 143c may be completely filled with a conductive material, or a conductive material may be formed along a wall of a via. Any shape may be applied, including a tapered shape, a cylindrical shape, or the like.

The fan-out semiconductor package 100A according to an exemplary embodiment in the present disclosure may further include a passivation layer 150 disposed on the second connection member 140. The passivation layer 150 may be configured to protect the second connection member 140 from an external physical or chemical damage, and the like. The passivation layer 150 may have an opening 151 exposing at least a portion of the redistribution layer 142c of the redistribution layers 142a, 142b, and 142c of the second connection member 140. The opening 151 may completely or partially expose one surface of the redistribution layer 142c, and may expose a side thereof as necessary.

The material of the passivation layer 150 is not particularly limited, and can be, for example, a photosensitive insulating material such as a photosensitive insulating resin, or solder resist, or an insulating resin not including a glass fiber but in which a filler is impregnated, for example, ABF including an inorganic filler and an epoxy resin, or the like. When ABF, or the like, is used, the material can be selected to satisfy Equation (1) to Equation (4) to improve board level reliability.

$$\text{Elastic modulus} \times \text{Coefficient of thermal expansion} \leq 230 \text{ GPa·ppm/}^\circ\text{C.} \quad \text{Equation (1):}$$

$$\text{Thickness} \geq 10 \text{ μm} \quad \text{Equation (2):}$$

$$\text{Surface roughness} \geq 1 \text{ nm} \quad \text{Equation (3):}$$

$$\text{Water absorption rate} \leq 1.5\% \quad \text{Equation (4):}$$

The fan-out semiconductor package 100A according to an exemplary embodiment in the present disclosure may further include a under bump metal layer 160 disposed on a wall inside the opening 151 of the passivation layer 150 and the redistribution layer 143c of the second connection member 140 which is exposed. The under bump metal layer 160 may improve connection reliability of the connection terminal 170 described later. As a result, board level reliability of the fan-out semiconductor package 100A may be improved. The under bump metal layer 160 may be formed in a metallization method using a conductive material.

The fan-out semiconductor package 100A according to an exemplary embodiment in the present disclosure may include the connection terminal 170 disposed on the under bump metal layer 160. The connection terminal 170 may be configured to allow the fan-out semiconductor package 100A to be physically and/or electrically connected externally. The fan-out semiconductor package 100A may be mounted on a motherboard of an electronic device through the connection terminals 170. Each of the connection terminals 170 may be formed using a conductive material, for example, solder, or the like, by way of example, but a material thereof is not limited thereto.

Each of the connection terminals 170 may be a land, a ball, a pin, or the like. The connection terminals 170 may be formed as multilayer structures or as a monolayer structure. When the connection terminals are formed as the multilayer structures, the connection terminals may include a copper pillar and a solder. When the connection terminals are formed as the monolayer structure, the connection terminals may include a tin-silver solder and copper. However, this is only an example, and the connection terminals are not limited thereto. The number, interval, disposition, or the like, of the connection terminals 170 is not particularly limited, and may be sufficiently modified depending on design particulars. For example, the connection terminals 170 may be provided in an amount of several tens to several thousands according to an amount of connection pads 122 of the semiconductor chip 120, but are not limited thereto. The connection terminals 170 may also be provided in an amount of several tens to several thousands or more or in an amount of several tens to several thousands or less.

At least one of the connection terminals 170 may be disposed in a fan-out region. The fan-out region is a region other than the region in which the semiconductor chip 120 is disposed. In other words, the fan-out semiconductor package 100A according to an exemplary embodiment in the present disclosure may be a fan-out package. The fan-out package may have excellent reliability as compared to a fan-in package, may implement a plurality of I/O terminals, and may facilitate a 3D interconnection. In addition, as compared to a ball grid array (BGA) package, a land grid array (LGA) package, or the like, the fan-out package may be mounted on an electronic device without a separate substrate. Thus, the fan-out package may be manufactured to have a small thickness, and may have price competitiveness.

Although not illustrated in the drawings, a metal layer may be further disposed on an inner wall of the through hole 110H of the first connection member 110, if necessary. In other words, the vicinity of a side of the semiconductor chip 120 may be surrounded by the metal layer. Heat generated by the semiconductor chip 120 may be effectively radiated in an upward and/or downward direction of the fan-out semiconductor package 100A through the metal layer, and the metal layer may effectively block electromagnetic waves.

Although not illustrated in the drawings, if necessary, a plurality of semiconductor chips may be disposed inside the through hole 110H of the first connection member 110, and the number of the through holes 110H of the first connection member 110 may be plural, with semiconductor chips disposed in respective through holes. Separate passive components such as a condenser, an inductor, and the like, may be embedded together with the semiconductor chip inside the through hole 110H. A surface mounted component may also be mounted on the passivation layer 150.

FIGS. 11A to 11D are views illustrating an exemplary process of manufacturing the fan-out semiconductor package of FIG. 9.

Figure 11A:
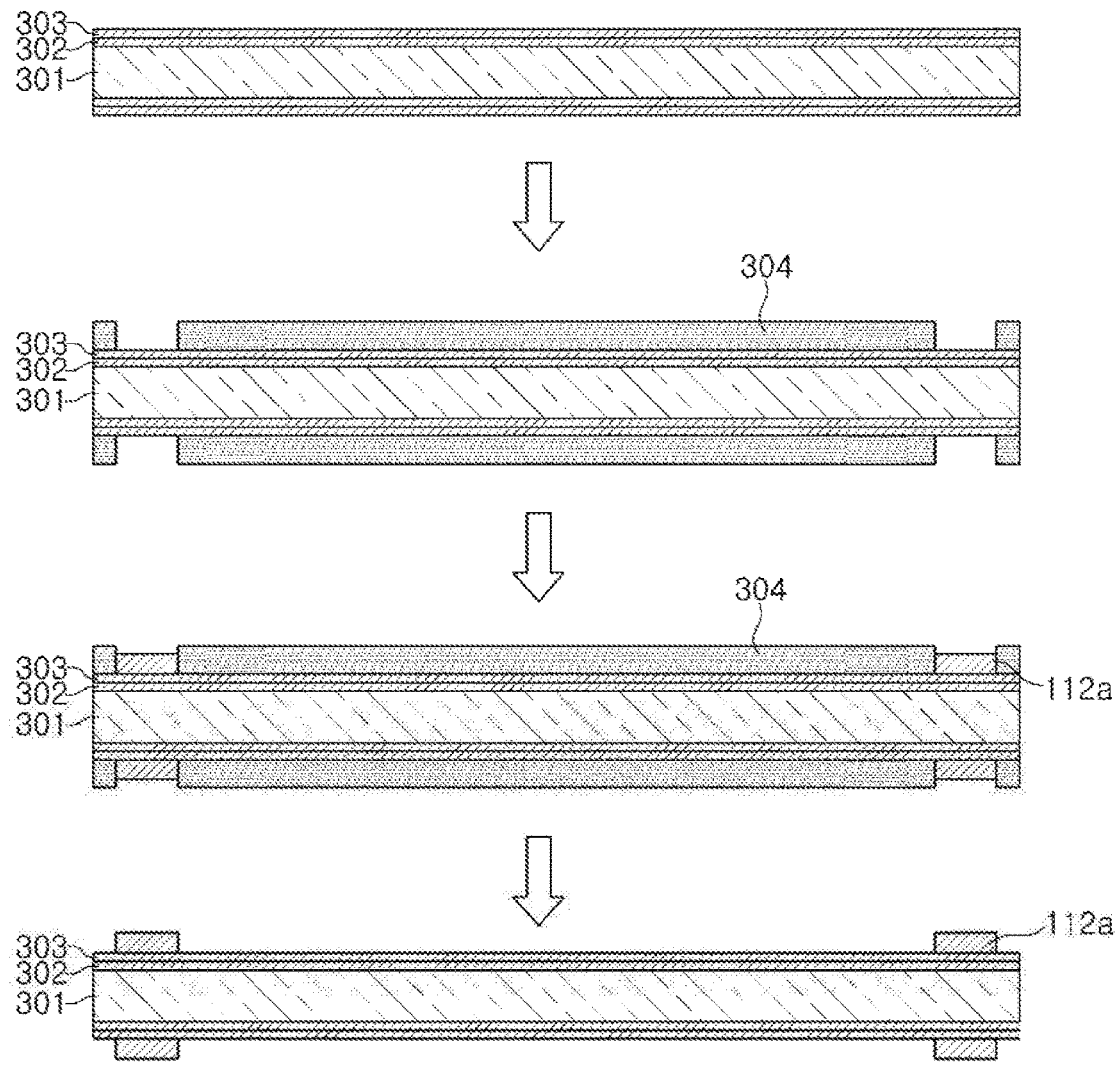
FIGS. 11A to 11D are views illustrating an exemplary process of manufacturing the fan-out semiconductor package of FIG. 9.

FIG. 11A shows a preparation of a carrier film 301. Metal films 302 and 303 may be formed on one or both surfaces of the carrier film 301. A joining surface between the metal films 302 and 303 may be surface-treated to allow the metal films to be easily separated from each other in a subsequent separation process. Alternatively, a release layer is provided between the metal films 302 and 303 to allow the metal films to be easily separated from each other in a subsequent process. The carrier film 301 may be an insulating substrate, and any material thereof is acceptable. The metal films 302 and 303 may be a Cu foil, but are not limited thereto. Alternatively, the metal films may be a thin foil formed using a different conductive material. Patterning for formation of the redistribution layer 112a using a dry film 304 may be performed. The redistribution layer may be formed using a photolithography method. The dry film 304 may be a dry film formed using a photosensitive material. A patterned space of the dry film 304 is filled with a conductive material to form the redistribution layer 112a. A plating process may be used. The metal film 303 may serve as a seed layer. The plating process may be an electrolytic copper plating, electroless copper plating, or the like. Chemical vapor deposition (CVD), physical vapor deposition (PVD), sputtering, a subtractive process, an additive process, a semi-additive process (SAP), a modified semi-additive process (MSAP), or the like, may be used to form the redistribution layer, but is not limited thereto. The dry film 304 is removed by using a method such as an etching process, or the like.

Figure 11B:
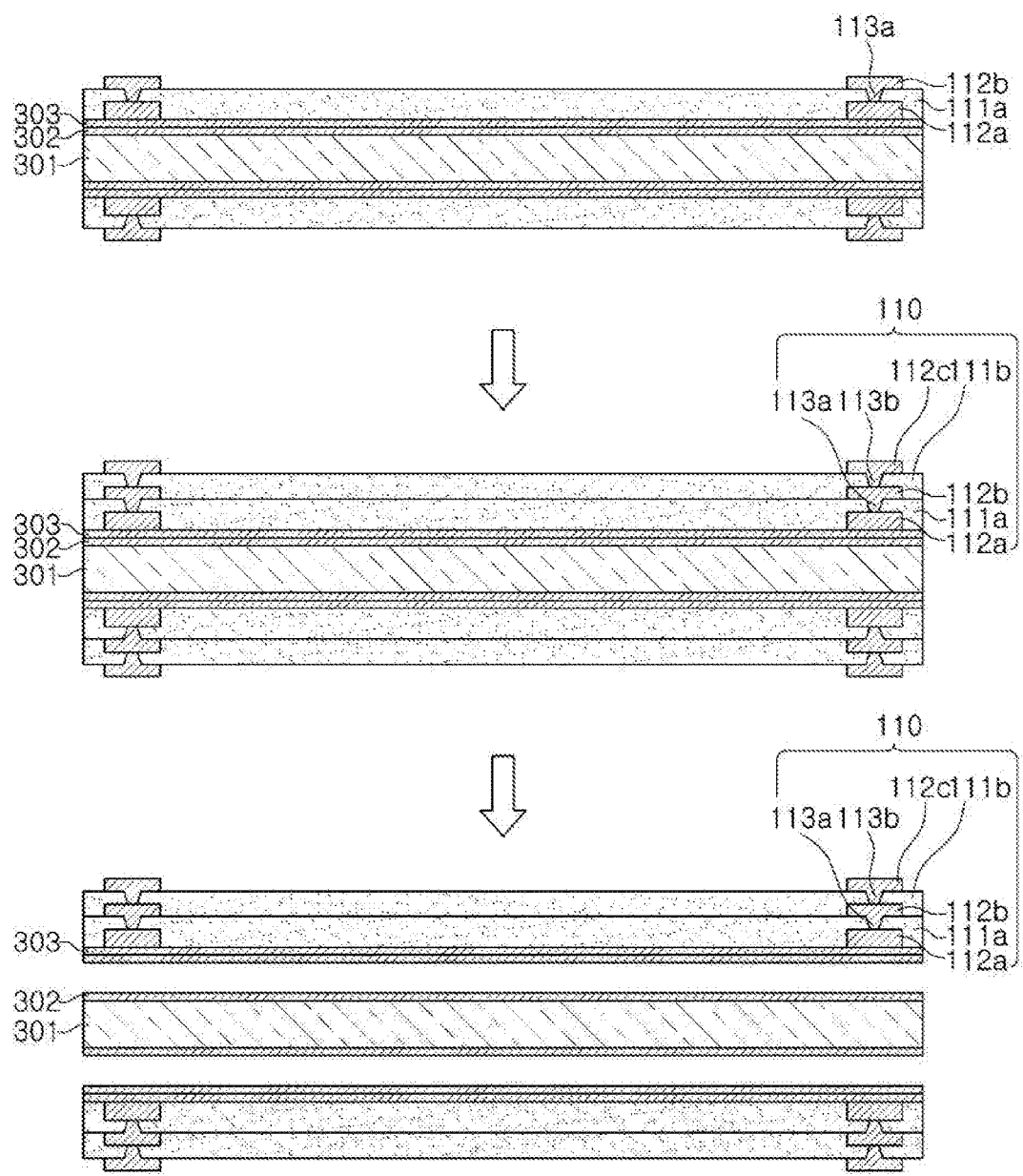

FIG. 11B shows a formation of the insulating layer 111a, with at least a portion of the redistribution layer 112a embedded, on the metal film 303. A via 113a passing through the insulating layer 111a may be formed. The redistribution layer 112b may be formed on the insulating layer 111a. The insulating layer 111a may be formed in a method in which a precursor thereof is laminated using a lamination method to be hardened, or a method in which a precursor material is applied in an applying method to be hardened, or the like. The via 113a and the redistribution layer 112b may be formed in a method in which a via hole is formed using mechanical drilling and/or laser drilling, or the like, to be patterned using a dry film, or the like, and the via hole and a patterned space are filled in a plating process, or the like. An insulating layer 111b with the redistribution layer 112b embedded may be formed on the insulating layer 111a. The via 113b passing through the insulating layer 111b may be formed. The redistribution layer 112c may be formed on the insulating layer 111b. A formation method thereof is the same as described above. The carrier film 301 can be peeled off. Peeling may separate the metal films 302 and 303 from each other. A blade may be used for separation, but the separation is not limited thereto, and any method may be used.

The first connection member 110 is described being formed before formation of a through hole before the carrier film 301 is peeled off, but is not limited thereto. After the carrier film 301 is peeled off, the first connection member 110 may be formed according to the processes described above. In other words, the process order is not necessarily limited to an order of description above.

Figure 11C:
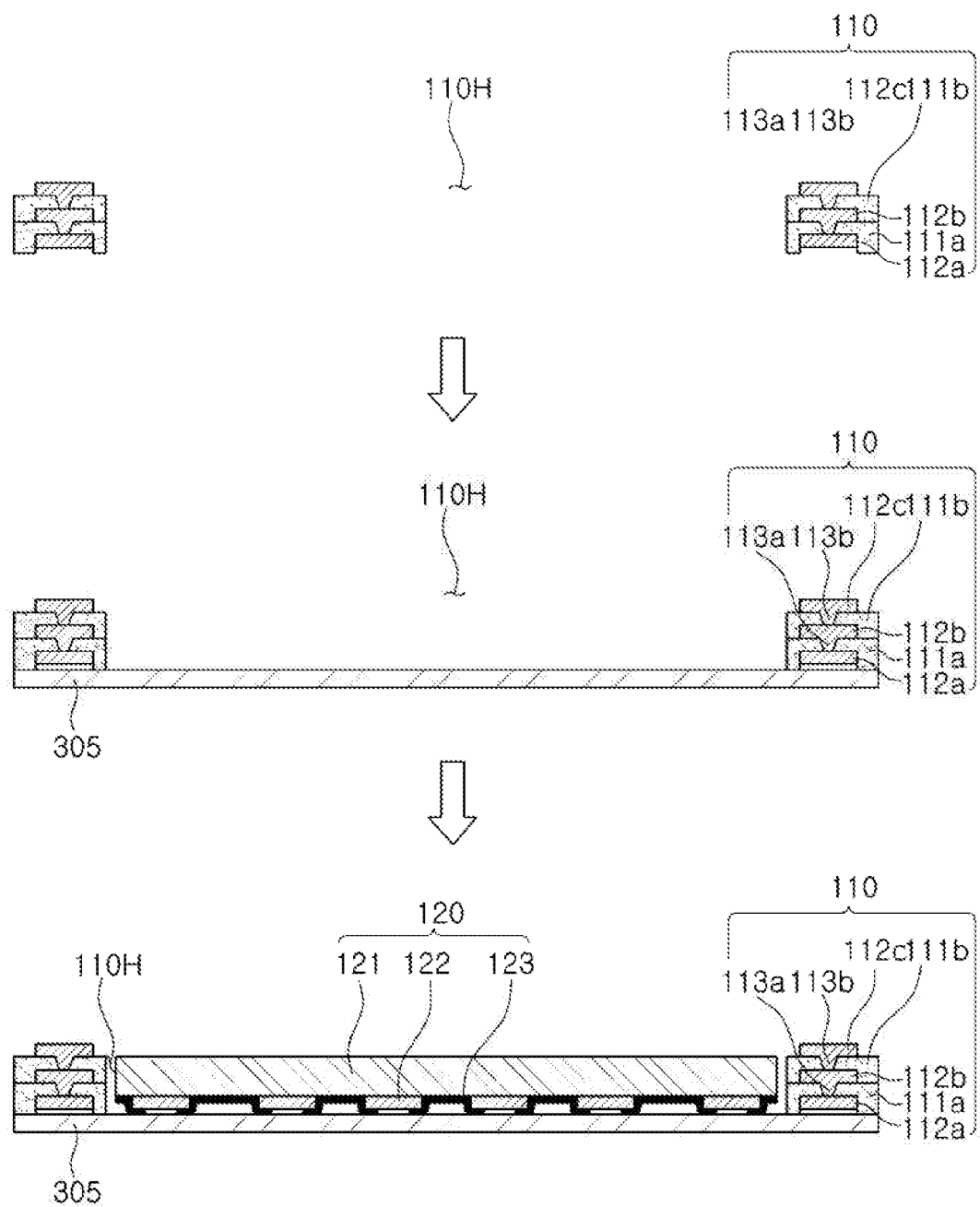

FIG. 11C shows a remaining metal film 303 removed and a formation of a through hole 110H. The remaining metal film 303 can be removed by an etching method, or the like. A portion of the redistribution layer 112a can be removed to allow the redistribution layer 112a to be recessed inwardly of the insulating layer 111a. The through hole 110H is formed inside the insulating layers 111a and 111b. The through hole 110H may be formed by using mechanical drilling and/or laser drilling. However, formation of the through hole is not limited thereto, and may be performed in a sand blast method using an abrasive particle, a dry etching method using plasma, or the like. When the through hole is formed by using mechanical drilling and/or laser drilling, a desmearing treatment such as a permanganate method, or the like, can be performed to remove a resin smear inside the through hole 110H. An adhesive film 305 may be attached below the insulating layers 111a and 111b. One surface of the redistribution layer 112a may be attached to have a step height from one surface of the adhesive film 305. Any material can be used as the adhesive film 305, as long as the material is able to fix the insulating layers 111a and 111b. A tape, or the like, may be used by way of example, without limitation. For example, the tape may be a heat treatment curable adhesive tape in which adhesion is weakened by heat treatment, an ultraviolet curable adhesive tape in which adhesion is weakened by ultraviolet irradiation, or the like. The semiconductor chip 120 may be disposed inside the through hole 110H of the insulating layers 111a and 111b. For example, the semiconductor chip can be disposed in a method where the semiconductor chip 120 is attached to the adhesive film 305 inside the through hole 110H. The semiconductor chip 120 may be disposed in face-down form to allow the connection pad 122 to be attached to the adhesive film 305. In this case, one surface of the connection pad 122 is attached, to have a step height based on the upper surface of the adhesive film 305, that is, to allow the connection pad 122 to be recessed inwardly of the semiconductor chip 120 after the connection pad is attached to the adhesive film 305.

Figure 11D:
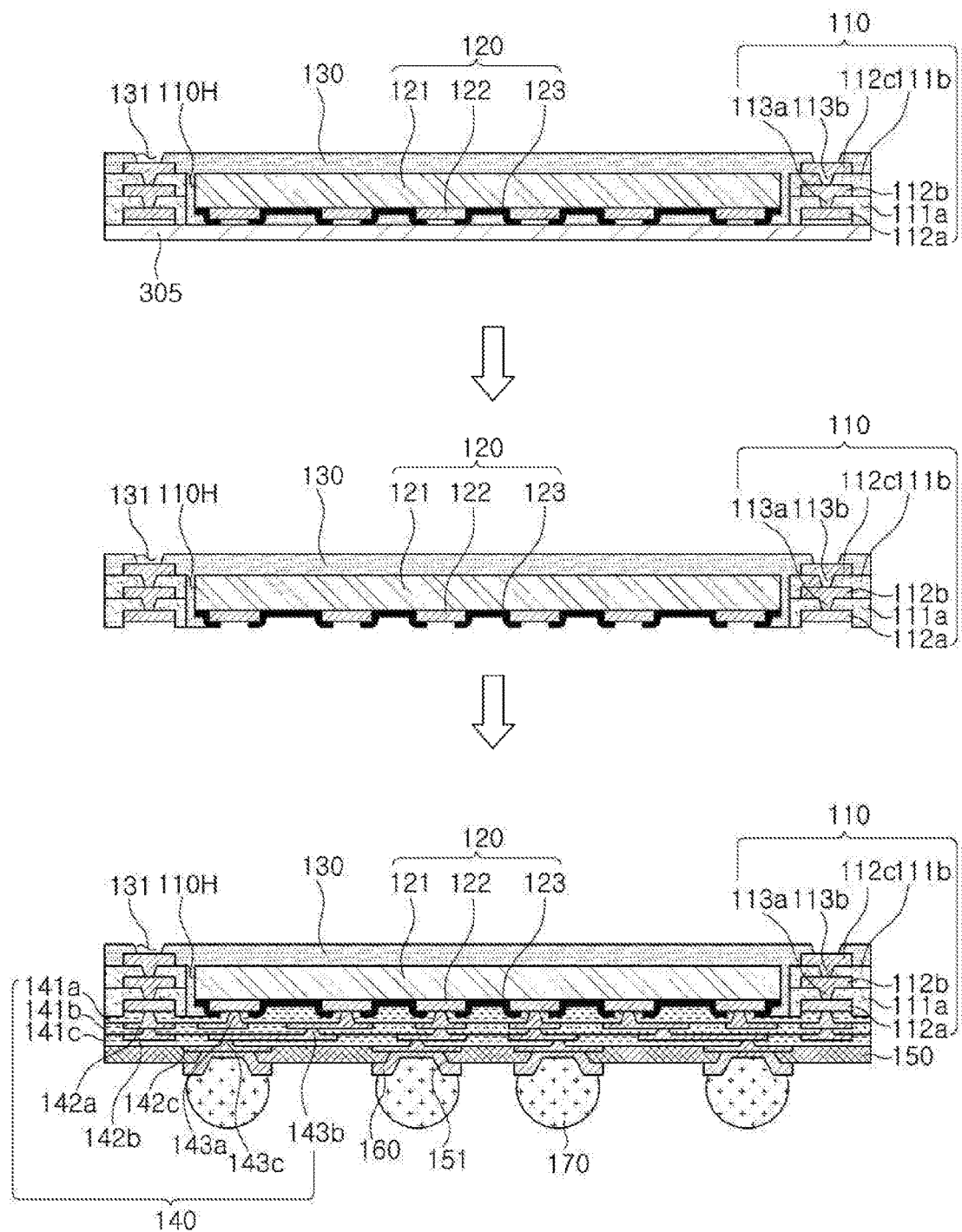

FIG. 11D shows the semiconductor chip 120 being encapsulated using the encapsulant 130. The encapsulant 130 may cover the first connection member 110 and the semiconductor chip 120, and may fill a space inside the through hole 110H. The encapsulant 130 may be formed using an appropriate method. For example, after a resin for formation of the encapsulant 130 is laminated while the resin is unhardened, the resin can be hardened to form the encapsulant. Alternatively, in order to encapsulate a first connection member and the semiconductor chip 120 on the adhesive film 305, after a resin for formation of the encapsulant 130 is applied while the resin is unhardened, the resin can be hardened to form the encapsulant. The semiconductor chip 120 may be fixed due to hardening. A lamination method may be, for example, a method in which a resin is pressurized for a certain time at high temperature, and then, a pressure is reduced and the resin is cooled to room temperature in a hot press process, and the resin is cooled in a cold press process thereafter to separate a working tool, or the like. An application method may be, for example, a screen printing method of applying ink by squeezing, a spray printing method in which ink is fogged to be applied, or the like. After hardening, in the encapsulant 130, one surface thereof has a step height in relation to one surface of the redistribution layer 112a and one surface of the connection pad 122. The adhesive film 305 can be peeled off. A peeling method is not particularly limited. For example, when the adhesive film 305 is a heat treatment curable adhesive tape in which adhesion is weakened by heat treatment, or a ultraviolet curable adhesive tape in which adhesion is weakened by ultraviolet irradiation, or the like, peeling may be performed after the adhesive film 305 is heat-treated to weaken adhesion, or may be performed after the adhesive film 305 is irradiated with ultraviolet rays to weaken adhesion. The second connection member 140 may be formed below the first connection member 110, from which the adhesive film 305 is removed, and the semiconductor chip 120. The second connection member 140 may be formed by sequentially forming the insulating layers 141a, 141b, and 141c, and forming the redistribution layers 142a, 142b, and 142c and the vias 143a, 143b, and 143c, in a plating process, or the like, as described above, in a corresponding layer thereof, after each of the insulating layers 141a, 141b, and 141c is formed.

If necessary, a passivation layer 150 may be formed on the second connection member 140. The passivation layer 150 may be formed in a method in which a precursor of the passivation layer 150 is laminated to be hardened, a method in which a formation material of the passivation layer 150 is applied to be hardened, or the like. In the passivation layer 150, an opening may be formed to expose at least a portion of the redistribution layer 142c of the second connection member 140, and the under bump metal layer 160 may be formed above in a metalization method.

If necessary, a connection terminal 170 may be formed on the under bump metal layer 160. The formation method of the connection terminal 170 is not particularly limited, and the connection terminal may be formed depending on a structure or form thereof. The connection terminal 170 may be fixed by reflow. To strengthen fixing force, a portion of the connection terminal 170 is embedded in the passivation layer 150, a remaining portion thereof can be exposed externally, thereby improving reliability.

A carrier film 301 having a large size can be prepared to be easily mass produced, a plurality of fan-out semiconductor packages 100A can be manufactured in the processes described above, and singulation may be performed as an individual fan-out semiconductor package 100A in a sawing process. This can provide excellent productivity.

Figure 12:
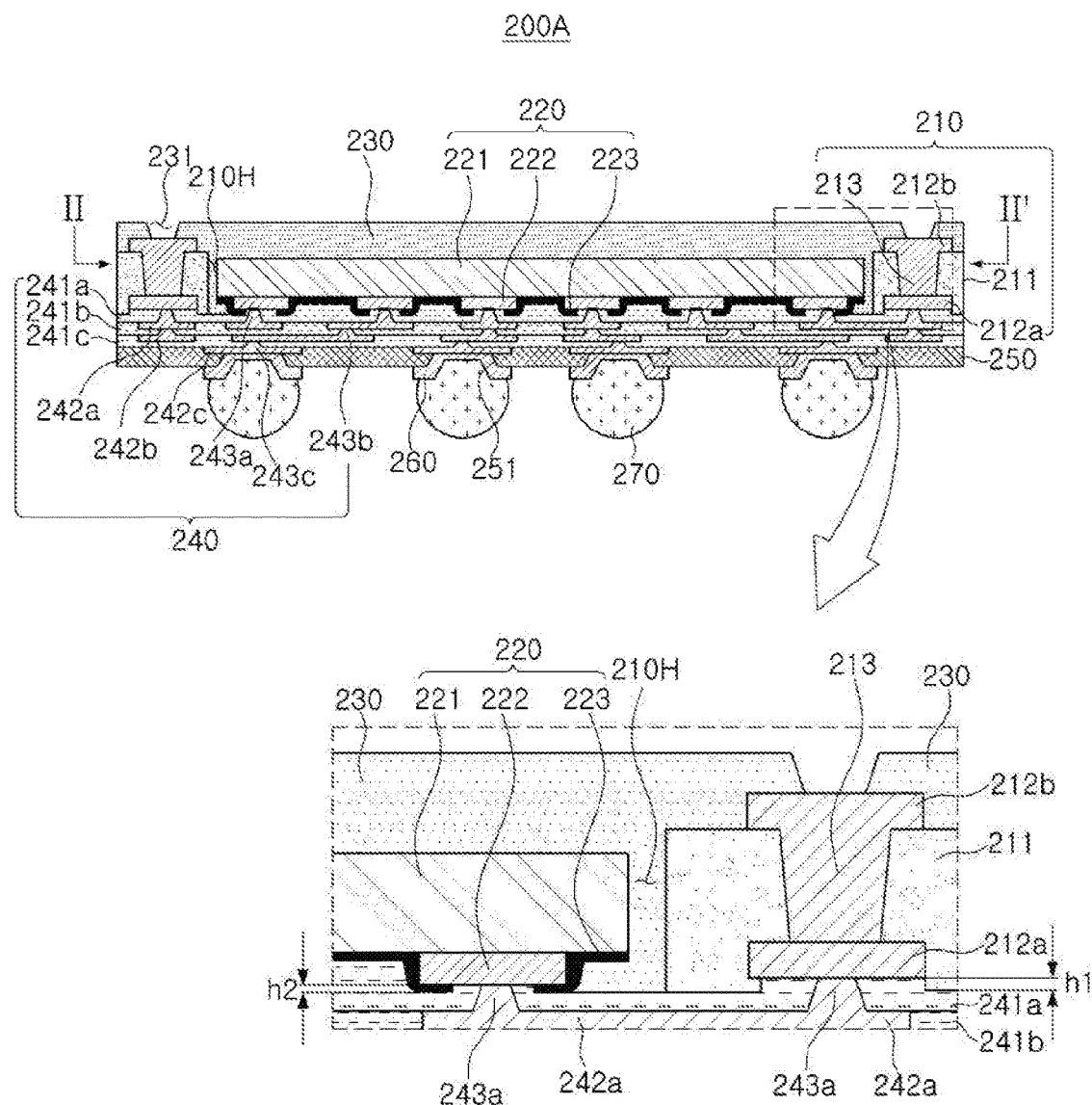
FIG. 12 is a schematic cross-sectional view illustrating another example of a fan-out semiconductor package.

FIG. 12 is a schematic cross-sectional view illustrating another example of a fan-out semiconductor package.

Figure 13:
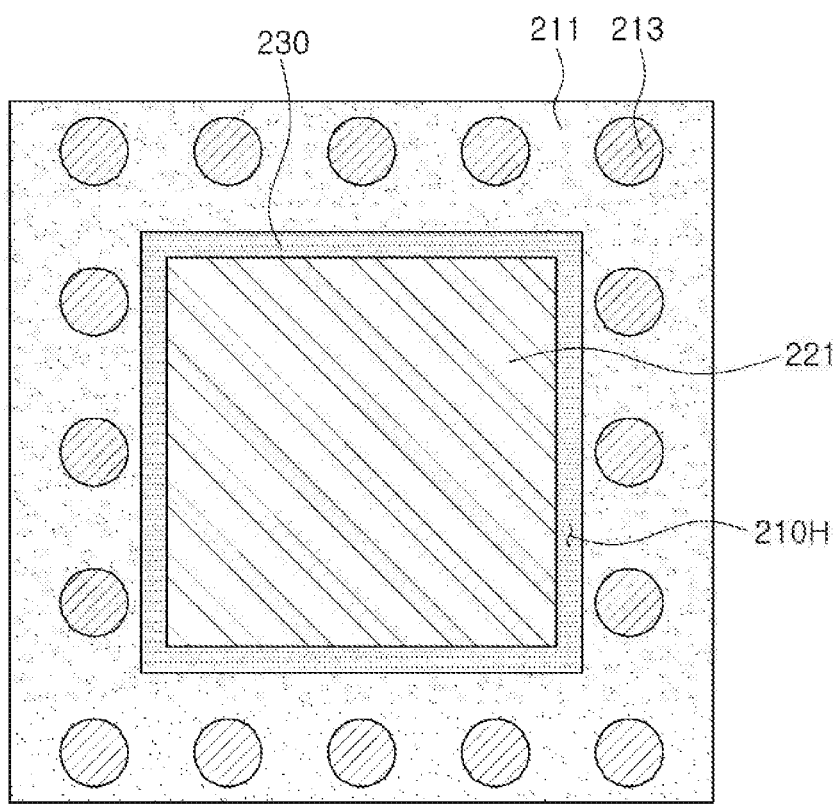
FIG. 13 is a schematic plan view taken along line II-II' of the fan-out semiconductor package of FIG. 12.

FIG. 13 is a schematic plan view taken along line II-II' of the fan-out semiconductor package of FIG. 12.

Hereinafter, overlapping discussion of features in the present exemplary embodiment that correspond to those described in relation to the previous exemplary embodiment are omitted.

Referring to FIGS. 12 and 13, the via 213 allows the redistribution layers 212a and 212b formed on different levels to be electrically connected to each other. As a result, an electrical path is formed inside the first connection member 210. The formation material of the via 213 may be a conductive material, such as copper (Cu), aluminum (Al), silver (Ag), tin (Sn), gold (Au), nickel (Ni), lead (Pb), titanium (Ti), or alloys thereof, or the like. The via 213 may be completely filled with a conductive material, or a conductive material may be formed along a wall of a via hole. The via 213 may have a tapered shape as per the drawing. This can provide convenience, and plating may be easily performed. However, the shape of the via is not necessarily limited thereto. In some cases, a diameter may be approximately constant. For example, the via 213 may have a cylindrical shape. A diameter denotes a distance from side to side when viewed in a cross section, and the shape of the via is not necessarily limited to a circle or an ellipse.

FIGS. 14A to 14D are views illustrating an exemplary process of manufacturing the fan-out semiconductor package of FIG. 12.

Hereinafter, overlapping discussion of steps and features in the present exemplary embodiment that correspond to those described in relation to the previous exemplary embodiment are omitted.

Figure 14A:
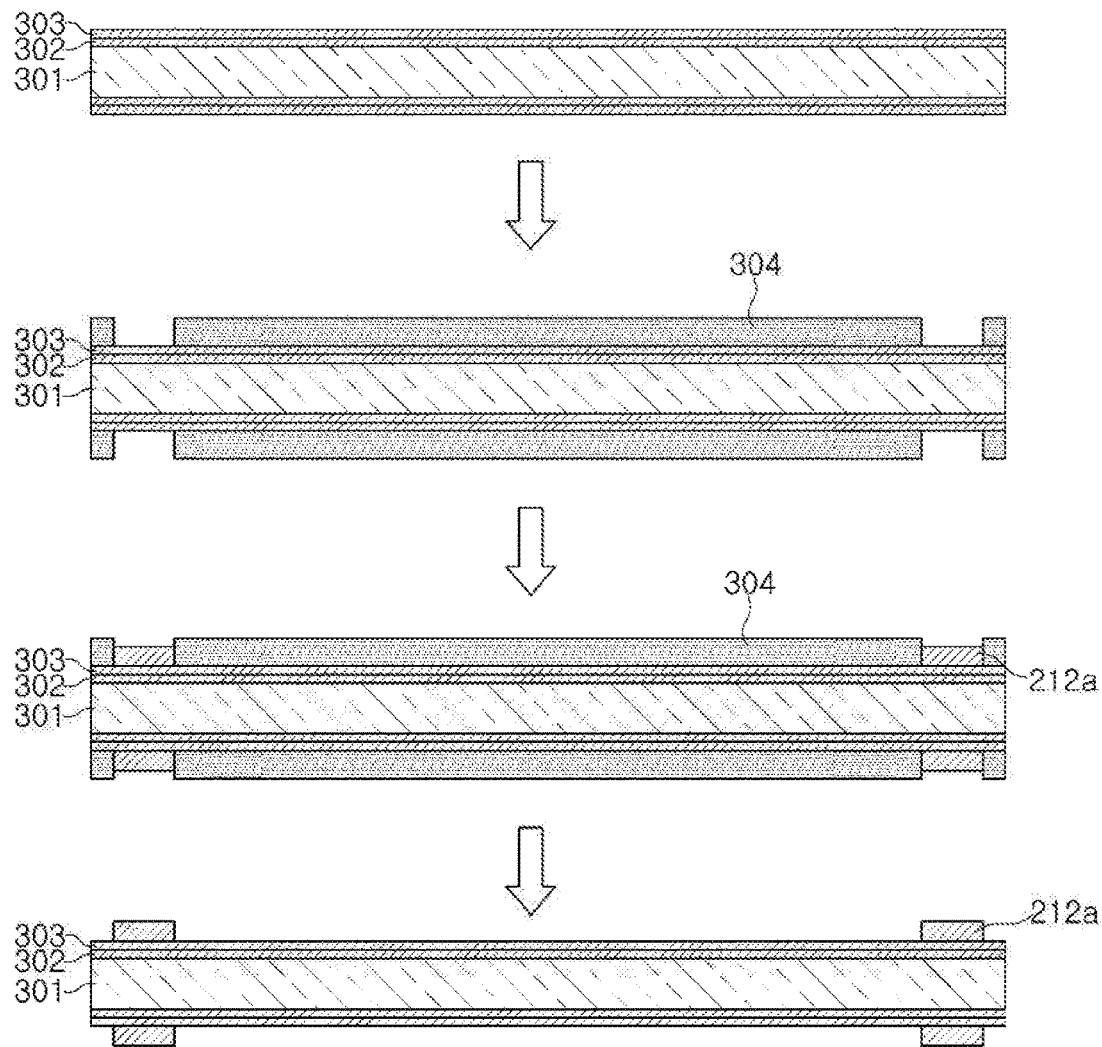
FIGS. 14A to 14D are views illustrating an exemplary process of manufacturing the fan-out semiconductor package of FIG. 12.
Figure 14B:
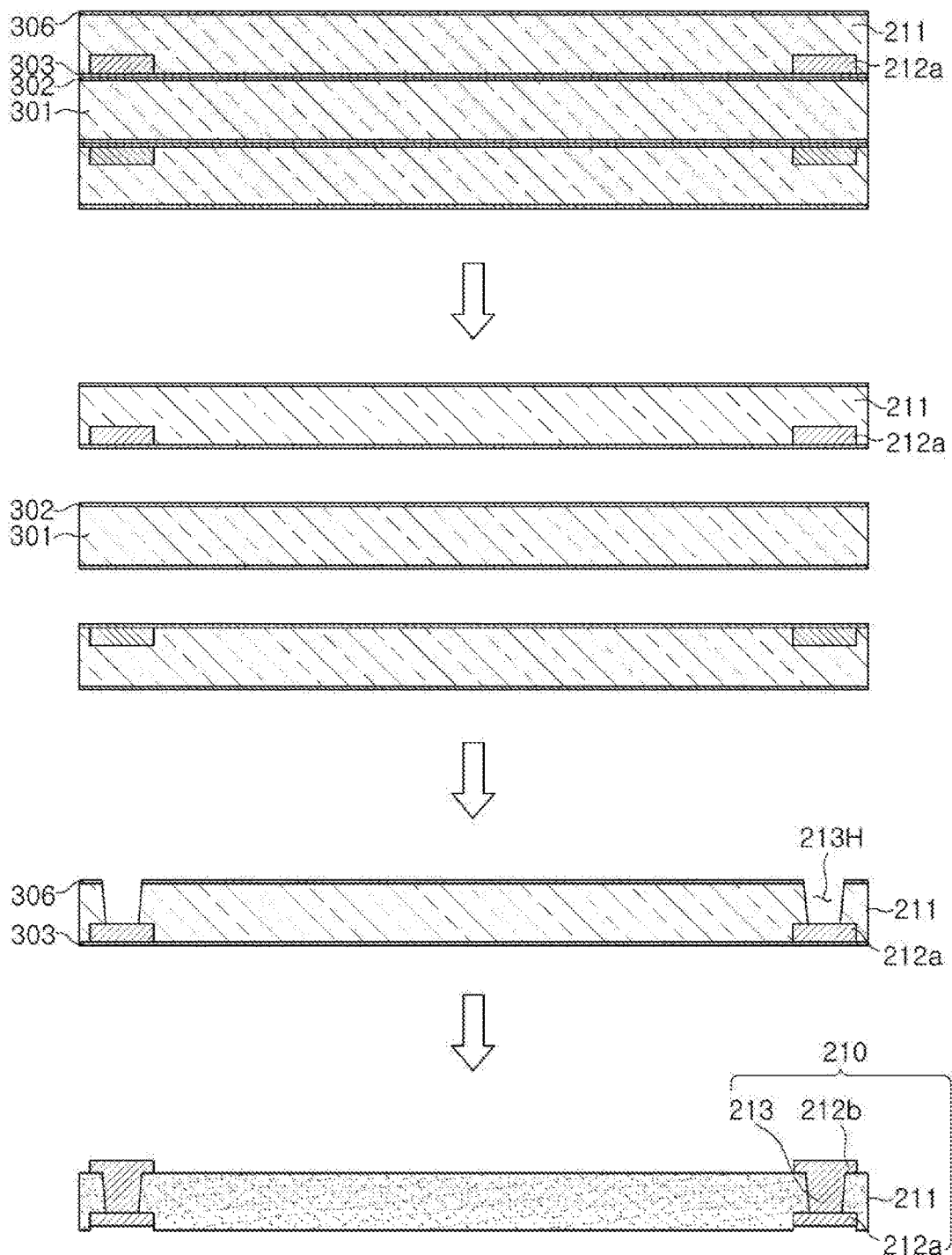
Figure 14C:
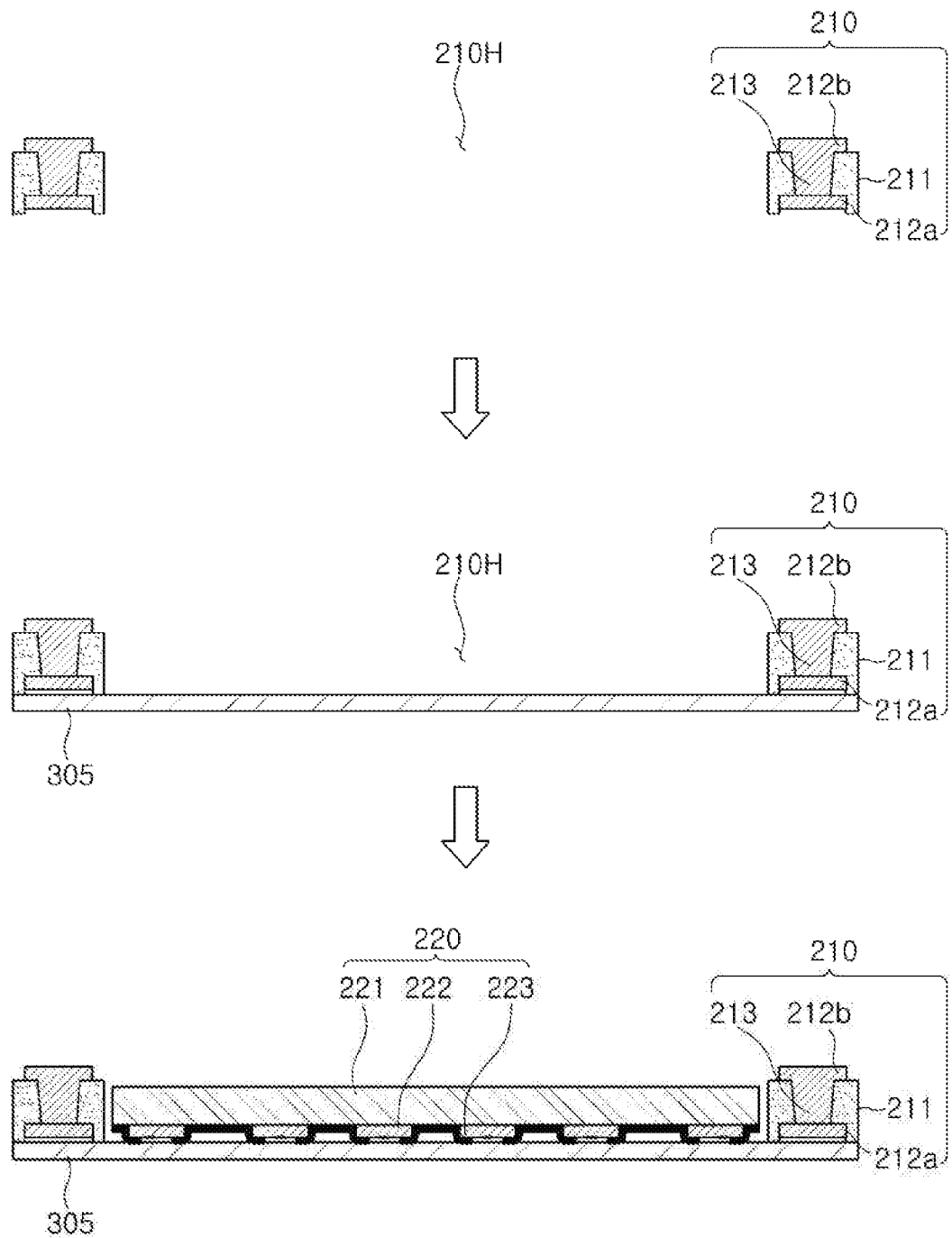
Figure 14D:
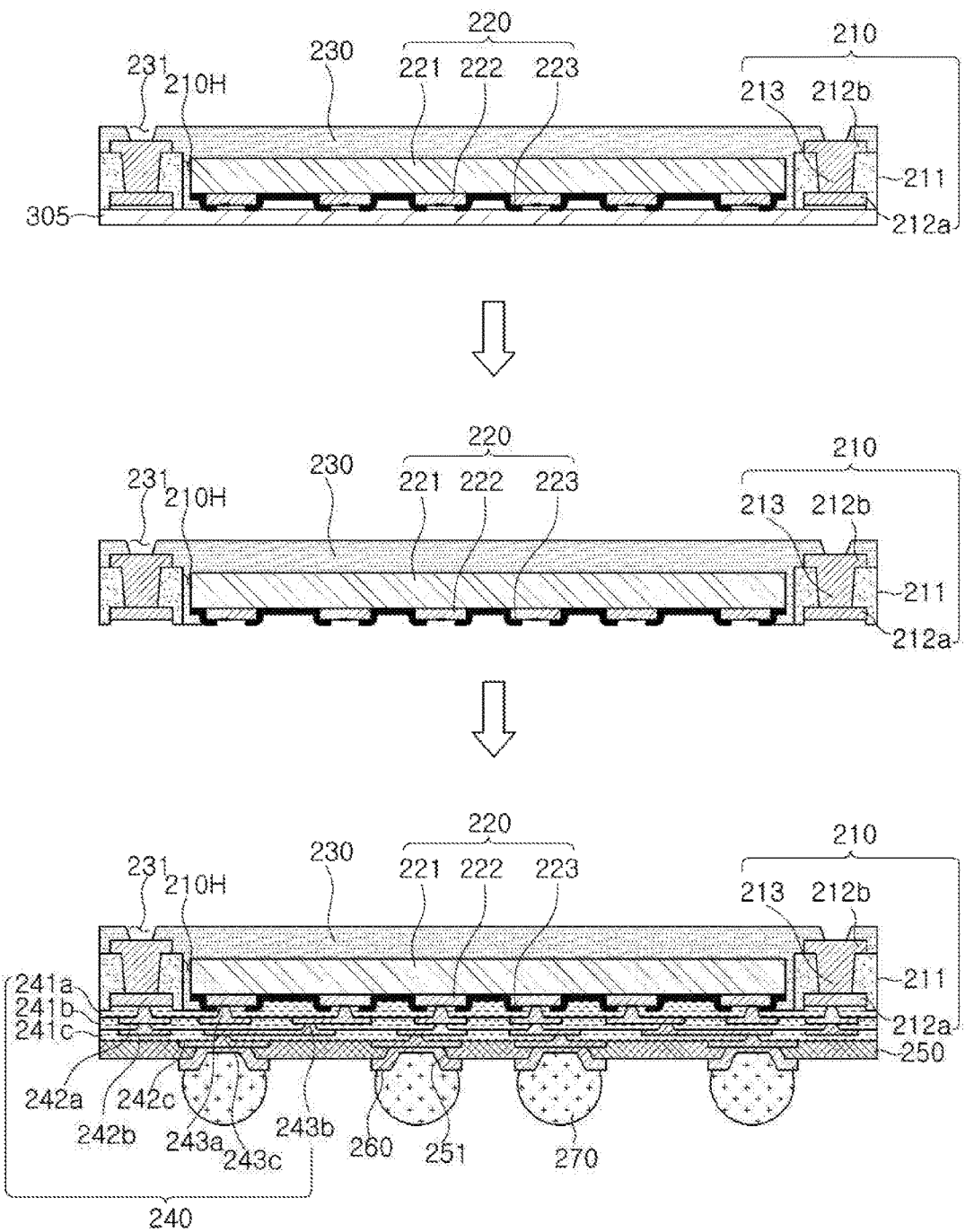

FIG. 14B shows a formation of an insulating layer 211, with at least a portion of the redistribution layer 212a embedded, on the metal film 303. A metal film 306 which may be used as a seed layer for formation of the redistribution layer 212b in a subsequent process may be formed on the insulating layer 211. The carrier film 301 can be peeled off. A portion of the redistribution layer 212a may be used as a pad to form a hole 213H for a via, which may be performed in a sand blast method using mechanical drilling and/or laser drilling and/or an abrasive particle, and/or a dry etching method using plasma, or the like. The via 213 and the redistribution layer 212b may be formed in a plating process, or the like. A remaining metal film 303 can be removed in an etching method, or the like. In this case, to allow the redistribution layer 212a to be recessed inwardly of the insulating layer 211, a portion of the redistribution layer 212a can be removed. The process is not necessarily limited to the order as described above. For example, the first connection member 210 before formation of the through hole 210H may be formed before the carrier film is peeled off.

As set forth above, according to the exemplary embodiment in the present disclosure, a fan-out semiconductor package may be provided where a bleeding defect is solved and a via reliability is improved.

While exemplary embodiments have been shown and described above, it will be apparent to those skilled in the art that modifications and variations could be made without departing from the scope of the present invention as defined by the appended claims.

What is claimed is:

1. A fan-out semiconductor package, comprising:
a first connection member having a through hole;
a semiconductor chip in the through hole of the first connection member, having an active surface with a connection pad and an inactive surface on an opposing side of the semiconductor chip;
an encapsulant encapsulating at least a portion of the first connection member and a portion of the semiconductor chip; and
a second connection member on the first connection member and the semiconductor chip,
wherein each of the first connection member and the second connection member include respective redistribution layers electrically connected to the connection pad of the semiconductor chip,
a first interface between the second connection member and the encapsulant is located on a different level from either a level of a second interface between the second connection member and the redistribution layer of the first connection member or a level of a third interface between the second connection member and the connection pad of the semiconductor chip,
the second connection member includes an insulating layer disposed between the redistribution layers of the second connection member and the first interface, and the insulating layer directly contacts the semiconductor chip in at least one location, and
the encapsulant integrally extends between the insulating layer of the second connection member and the semiconductor chip in a stacking direction of the second connection member on the semiconductor chip, and between the first connection member and the semiconductor chip.

2. The fan-out semiconductor package of claim 1, wherein a lower surface of the redistribution layer of the first connection member in contact with the second connection member and a lower surface of the connection pad of the semiconductor chip in contact with the second connection member are recessed in relation to the interface between the second connection member and the encapsulant.

3. The fan-out semiconductor package of claim 2, wherein:
a step height of the lower surface of the redistribution layer of the first connection member in contact with the second connection member with respect to the interface between the second connection member and the encapsulant is h1, a step height of the lower surface of the connection pad of the semiconductor chip in contact with the second connection member with respect to the interface between the second connection member and the encapsulant is h2, and h1>h2 is satisfied.

4. The fan-out semiconductor package of claim 2, wherein:
a step height of the lower surface of the redistribution layer of the first connection member in contact with the second connection member with respect to the interface between the second connection member and the encapsulant is h1,
a step height of the lower surface of the connection pad of the semiconductor chip in contact with the second connection member with respect to the interface between the second connection member and the encapsulant is h2,
h1 is greater than h2 and is within the range of 0.5 μm to 4.0 μm, and
h2 is within the range of 0.5 μm to 1.0 μm.

5. The fan-out semiconductor package of claim 1, wherein the semiconductor chip includes a body, the active surface of the semiconductor chip forming one surface of the body having the connection pad disposed thereon, and a passivation film disposed on the one surface of the body and covering a portion of the connection pad.

6. The fan-out semiconductor package of claim 5, wherein the encapsulant integrally extends into a space between the passivation film of the semiconductor chip and the second connection member along the stacking direction.

7. The fan-out semiconductor package of claim 1, wherein a lowermost redistribution layer of the first connection member is embedded in a lower side of the first connection member with an exposed lower surface.

8. The fan-out semiconductor package of claim 7, wherein, on an upper side of the first connection member, an uppermost redistribution layer protrudes upwardly from the first connection member.

9. The fan-out semiconductor package of claim 8, wherein the lowermost redistribution layer and the uppermost redistribution layer are electrically connected to each other by one or more vias in the first connection member.

10. The fan-out semiconductor package of claim 8, wherein the first connection member further includes a middle redistribution layer between the lowermost redistribution layer and the uppermost redistribution layer.

11. The fan-out semiconductor package of claim 10, wherein the middle redistribution layer is electrically connected to each of the lowermost redistribution layer and the uppermost redistribution layer by the one or more vias.

12. The fan-out semiconductor package of claim 8, wherein the first connection member has a single redistribution layer that is both the uppermost redistribution layer and the lowermost redistribution layer.

13. The fan-out semiconductor package of claim 1, further comprising:
a lower passivation layer on the second connection member and with an opening exposing at least a portion of a lowermost redistribution layer of the second connection member;
an under bump metal layer on the opening of the passivation layer and connected to the exposed lowermost redistribution layer of the second connection member; and
a connection terminal on the under bump metal layer, and in which at least one thereof is in a fan-out region.

14. A fan-out semiconductor package, comprising:
a second connection member including a redistribution layer;
a first connection member on the second connection member, having a through hole, and including a lowermost redistribution layer electrically connected to the redistribution layer of the second connection member and embedded with an exposed lower surface;
a semiconductor chip in the through hole of the first connection member and on the second connection member, and including a connection pad electrically connected to the redistribution layer of the second connection member; and
an encapsulant on the second connection member, and encapsulating at least a portion of the second connection member and at least a portion of the semiconductor chip,
wherein the exposed lower surface of the lowermost redistribution layer of the first connection member has a step height from a lower surface of the encapsulant,
the second connection member includes an insulating layer disposed between the redistribution layer of the second connection member and a surface of the second connection member on which the semiconductor chip is disposed, and the insulating layer directly contacts the semiconductor chip in at least one location, and
the encapsulant integrally extends between the insulating layer of the second connection member and the semiconductor chip in a stacking direction of the second connection member on the semiconductor chip, and between the first connection member and the semiconductor chip.

15. The fan-out semiconductor package of claim 14, wherein a lower surface of the connection pad of the semiconductor chip has a step height from the lower surface of the encapsulant.

16. A fan-out semiconductor package, comprising:
a second connection member in which a redistribution layer is formed;
a first connection member on the second connection member, having a through hole, and including a lowermost redistribution layer electrically connected to the redistribution layer of the second connection member and embedded with an exposed lower surface;
a semiconductor chip in the through hole of the first connection member and on the second connection member, and including a connection pad electrically connected to the redistribution layer of the second connection member; and
an encapsulant on the second connection member, and encapsulating at least a portion of the second connection member and at least a portion of the semiconductor chip,
wherein a lower surface of the connection pad of the semiconductor chip has a step height from a lower surface of the encapsulant,
the second connection member includes an insulating layer disposed between the redistribution layer of the second connection member and a surface of the second connection member on which the semiconductor chip is disposed, and the insulating layer directly contacts the semiconductor chip in at least one location, and
the encapsulant integrally extends between the insulating layer of the second connection member and the semiconductor chip in a stacking direction of the second connection member on the semiconductor chip, and between the first connection member and the semiconductor chip.

17. A fan-out semiconductor package, comprising:
a first connection member including a through hole and with one or more lower electrical connections with outer surfaces recessed from a lower surface of the first connection member by a first step height h1;
a semiconductor chip within the through hole and including a plurality of connection pads with outer surfaces recessed from a lower surface of the semiconductor chip by a second step height h2;
a second connection member below the first connection member and semiconductor chip, with an insulating layer formed on an upper surface of the second connection member and facing the lower electrical connections of the first connection member and the connection pads of the semiconductor chip, wherein the insulating layer directly contacts the semiconductor chip in at least one location; and
an encapsulant in the through hole and on at least a portion of the upper surface of the second connection member to integrally extend between the insulating layer of the second connection member and the semiconductor chip in a stacking direction of the second connection member on the semiconductor chip, and between the first connection member and the semiconductor chip.

18. The fan-out semiconductor package of claim 17, wherein the first step height h1 is greater than the second step height h2.

19. The fan-out semiconductor package of claim 17, wherein the first connection member includes:
one or more upper electrical connections with outer surfaces protruding from an upper surface of the first connection member and electrically connected to respective lower electrical connections.

20. The fan-out semiconductor package of claim 17, wherein the second electrical connection member includes:
one or more upper electrical connections electrically connected to connection pads of the semiconductor chip or lower electrical connections of the first connection member; and
one or more lower electrical connections electrically connected to respective upper electrical connections and connected to a circuit board by respective connection terminals.

21. The fan-out semiconductor package of claim 17, wherein the semiconductor chip includes:
a passivation film providing the lower surface of the semiconductor chip, exposing the plurality of connection pads, and in contact with the second connection member,
wherein a portion of the passivation film has a thickness of the second step height h2.

22. The fan-out semiconductor package of claim 17, wherein the first connection member includes:
an insulating layer providing the lower surface of the first connection member, exposing the one or more lower electrical connections of the first connection member, and in contact with the second connection member,
wherein a portion of the insulating layer of the first connection member has a thickness of the first step height h1.

* * * * *